United States Patent
Tanaka

(10) Patent No.: US 7,498,833 B2
(45) Date of Patent: Mar. 3, 2009

(54) SEMICONDUCTOR INTEGRATED CIRCUIT

(75) Inventor: Isao Tanaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/783,898

(22) Filed: Apr. 12, 2007

(65) Prior Publication Data
US 2007/0279082 A1    Dec. 6, 2007

(30) Foreign Application Priority Data
Apr. 17, 2006    (JP)    ............... 2006-113034

(51) Int. Cl.
*H03K 19/01*    (2006.01)
(52) U.S. Cl. ............... 326/17; 326/33; 326/112; 326/119
(58) Field of Classification Search ............ 326/17, 326/33, 93, 95, 98, 112, 119, 121
See application file for complete search history.

(56) References Cited

U.S. PATENT DOCUMENTS

| | | | |
|---|---|---|---|
| 5,610,533 A * | 3/1997 | Arimoto et al. ............ 326/33 |
| 5,892,260 A | 4/1999 | Okumura et al. |
| 6,208,171 B1 * | 3/2001 | Kumagai et al. ............ 326/121 |
| 6,441,647 B2 * | 8/2002 | Jeon ............ 326/98 |
| 7,123,073 B2 * | 10/2006 | Nakatani et al. ............ 327/358 |
| 2003/0218494 A1 | 11/2003 | Kubo et al. |
| 2004/0216074 A1 | 10/2004 | Hart et al. |
| 2005/0093611 A1 | 5/2005 | Fujita et al. |

FOREIGN PATENT DOCUMENTS

JP    8-204140    8/1996

* cited by examiner

*Primary Examiner*—Anh Q Tran
(74) *Attorney, Agent, or Firm*—McDermott Will & Emery LLP

(57) ABSTRACT

A semiconductor integrated circuit comprises logic cones having a structure in which substrates thereof are isolated from each other and substrate potentials can be controlled, and a potential switching section for supplying a substrate voltage from any of a first substrate bias supply potential and a second substrate bias supply potential to the logic cone. A signal output by a logic cone previous to a logic cone whose substrate potential is controlled is input as a trigger signal to the substrate supply potential switching section.

39 Claims, 16 Drawing Sheets

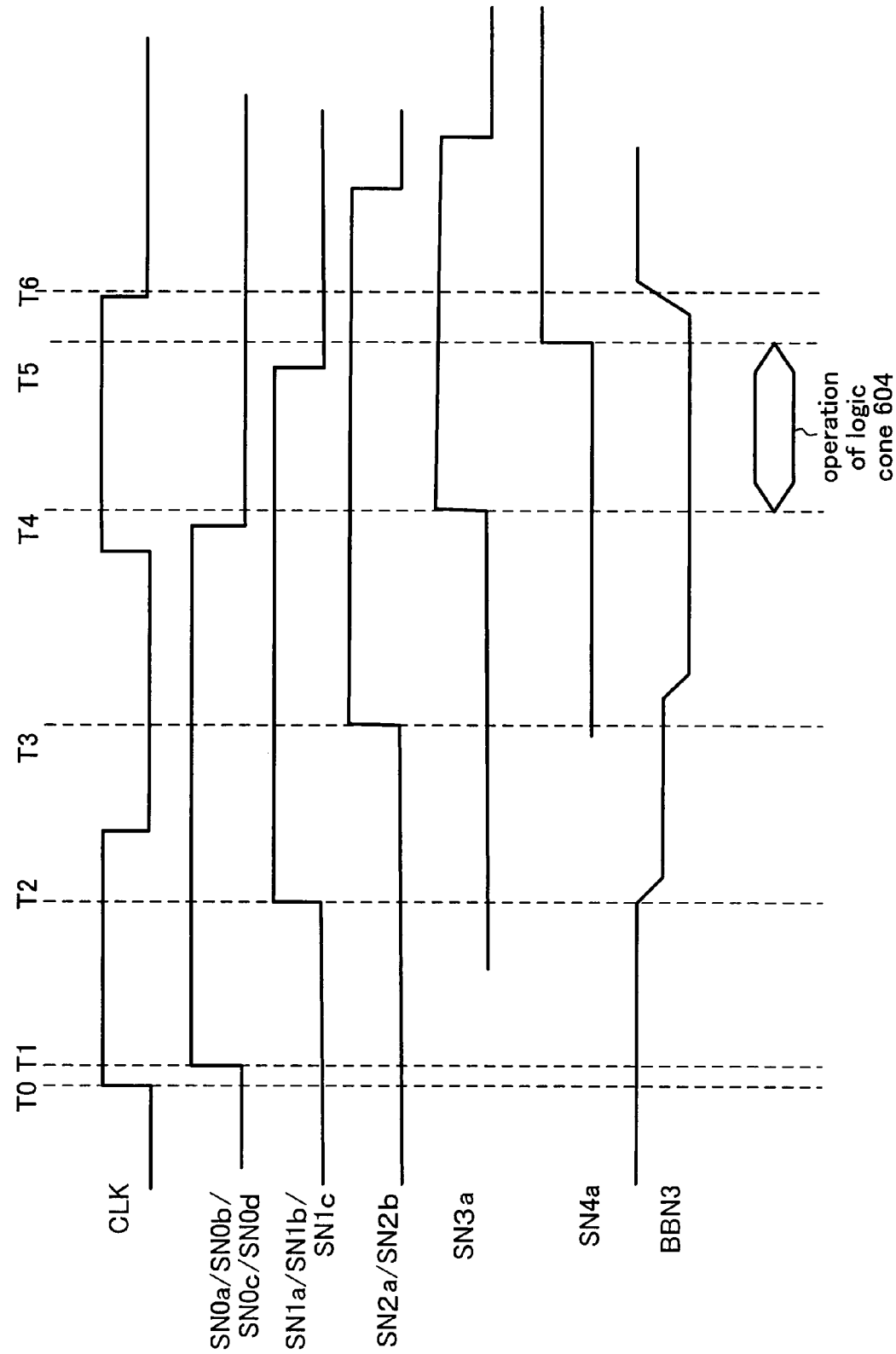

SEMICONDUCTOR INTEGRATED CIRCUIT

CROSS REFERENCE TO RELATED APPLICATIONS

This Non-provisional application claims priority under 35 U.S.C. §119(a) on Patent Application No. 2006-113034 filed in Japan on Apr. 17, 2006, the entire contents of which are hereby incorporated by reference.

BACKGROUND OF THE INVENTION

1. Field of the Invention

The present invention relates to a semiconductor integrated circuit having a logic circuit comprising MOS transistors. More particularly, the present invention relates to a semiconductor integrated circuit designed by a miniaturization process.

2. Description of the Related Art

Miniaturization processes have dramatically increased the number of transistors integrated on a semiconductor chip. Therefore, it has been possible to integrate a complex system on a semiconductor chip using a number of transistors which can operate with high speed. In a system LSI (semiconductor integrated circuit) employing such a semiconductor chip, the reduction of power consumption is a challenge. To achieve this, it is effective to enable the whole system LSI to operate with low voltage.

However, in order to maintain a high-speed operation, it is necessary to scale the threshold potential of the MOS transistor in accordance with the reduction of the power source voltage. In this case, a reduction in the threshold potential causes the MOS transistor not to be completely turned OFF, so that a so-called subthreshold current increases, unfortunately leading to an increase in power consumption.

To address such a problem, a conventional semiconductor integrated circuit has been proposed in which a substrate potential is controllable for each functional module (a circuitry having a predetermined function, such as an arithmetic circuit, a memory circuit or the like) so that the substrate potential of each functional module can be controlled, depending on whether the functional module is in the active state or in the standby state, thereby preventing an increase in the subthreshold current (see, for example, Japanese Unexamined Patent Application Publication No. 8-204140).

In such a semiconductor integrated circuit in which the substrate potential is controlled, in the active state, the P-region of the N-MOS transistor is biased to a potential which is higher than the ground potential and lower than the forward voltage of the PN junction. Also, the N-region of the P-MOS transistor is biased to a potential which is lower than the power source voltage and higher than a voltage which is obtained by subtracting the forward voltage of the PN junction from the power source voltage. Thereby, the threshold voltage of the MOS transistor is reduced, thereby making it possible to achieve a high-speed operation.

On the other hand, in the standby state, the P-region of the N-MOS transistor is biased to the ground potential. Also, the N-region of the P-MOS transistor is biased to the power source voltage. Thereby, the threshold voltage of the MOS transistor is increased, and the subthreshold current is decreased.

As described above, by controlling the substrate potential, it is possible to reduce the subthreshold current in the standby state while achieving a high-speed operation in the active state. In particular, the substrate potential is controlled in units of functional modules (functional circuitries) provided on the semiconductor chip, and therefore, this technique can achieve a semiconductor integrated circuit which has less power consumption caused by leakage current as compared to when the power source voltage or the like is controlled in units of semiconductor chips.

However, since the control of the substrate potential is carried out, depending on the operation mode of each functional module, even if the operation of a logic circuit (this is also comprised of MOS transistors) within a range in a functional module has been completed, the control of the substrate potential is not carried out unless the whole functional module goes to the standby state. Therefore, the threshold potential of the MOS transistor included in the logic circuit whose operation has been completed are left low until the control of the substrate potential is carried out, so that useless power is consumed due to leakage current.

SUMMARY OF THE INVENTION

In view of the above-described problems, the present invention has been achieved. An object of the present invention is to provide a semiconductor integrated circuit having logic circuits comprising MOS transistors, in which the power consumption of a logic circuit which is not operated in a functional module can be reduced while a high-speed operation is achieved.

To achieve the object, an embodiment of the present invention is a semiconductor integrated circuit having MOS transistors, comprising:

a functional module having a plurality of logic cones including a plurality of logic circuits; and a potential switching section connected to at least one of the logic cones and for controlling a substrate potential of the connected logic cone, wherein the logic cones have a structure in which substrates thereof are isolated from each other, are operated in accordance with predetermined input signals, and output signals depending on the input signals, and the potential switching section switches the substrate potential of the connected logic cone to any of a first substrate bias supply potential and a second substrate bias supply potential shallower than the first substrate bias supply potential in accordance with a signal output as the input signal by any of the logic cones.

Also, an embodiment of the present invention is a semiconductor integrated circuit having MOS transistors, comprising:

a functional module having a plurality of logic cones including a plurality of logic circuits; and a potential switching section connected to at least one of the logic cones and for controlling a power source potential of the connected logic cone, wherein the logic cones have a structure in which power sources thereof are isolated from each other, are operated in accordance with predetermined input signals, and output signals depending on the input signals, and the potential switching section switches the power source potential of the connected logic cone to any of a first power source potential and a second power source potential lower than the first power source potential in accordance with a signal output as the input signal by any of the logic cones.

Also, an embodiment of the present invention is a semiconductor integrated circuit having MOS transistors, comprising:

a functional module having a plurality of logic cones including a plurality of logic circuits; and a potential switching section connected to at least one of the logic cones and for controlling a substrate potential and a power source potential of the connected logic cone, wherein the potential switching section, when controlling the substrate potential, switches the substrate potential of the connected logic cone to any of a first substrate bias supply potential and a second substrate bias supply potential shallower than the first substrate bias supply potential in accordance with a signal output as the input signal by any of the logic cones, and when controlling the power source potential, switches the power source potential of the connected logic cone to any of a first power source potential and a second power source potential lower than the first power source potential in accordance with a signal output as the input signal by any of the logic cones.

Also, an embodiment of the present invention is a semiconductor integrated circuit having MOS transistors, comprising:

a functional module having a plurality of logic cones including a plurality of logic circuits; and a potential switching section connected to at least one of the logic cones and for controlling a back gate voltage of the connected logic cone, wherein the logic cones have a structure in which the back gate voltage can be controlled into voltages different from each other, are operated in accordance with predetermined input signals, and output signals depending on the input signals, and the potential switching section switches the back gate voltage of the connected logic cone to any of a first back gate voltage and a second back gate voltage lower than the first back gate voltage in accordance with a signal output as the input signal by any of the logic cones.

Also, an embodiment of the present invention is a semiconductor integrated circuit having MOS transistors, wherein a threshold potential or a power source potential of the MOS transistor is changed in accordance with transition of an activated state of the MOS transistor.

BRIEF DESCRIPTION OF THE DRAWINGS

FIG. 16 is a timing chart showing an active state of the semiconductor integrated circuit of Embodiment 6.

DETAILED DESCRIPTION OF THE PREFERRED EMBODIMENTS

Figure 1:
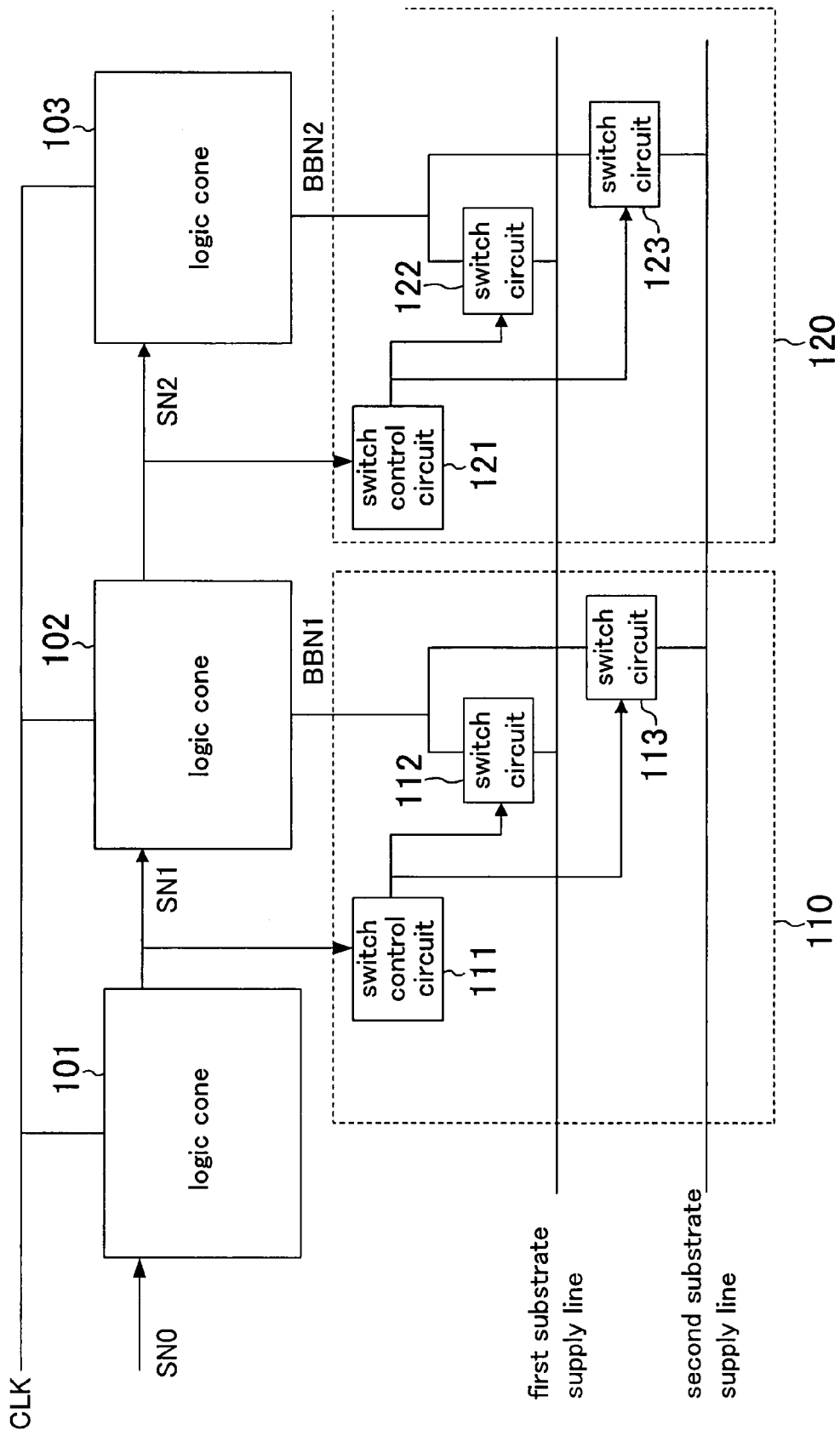
FIG. 1 is a block diagram showing a configuration of a semiconductor integrated circuit according to Embodiment 1 of the present invention.

Hereinafter, embodiments of the present invention will be described with reference to the accompanying drawings. Note that, in the following description of each embodiment, parts having the same functions as those which are once described are indicated by the same reference numerals and will not be repeatedly described.

Embodiment 1 of the Invention (Configuration of Semiconductor Integrated Circuit 100)

FIG. 1 is a block diagram showing a configuration of a semiconductor integrated circuit 100 according to Embodiment 1 of the present invention. As shown in FIG. 1, the semiconductor integrated circuit 100 comprises logic cones 101 to 103 and substrate supply potential switching sections 110 and 120.

Each of the logic cones 101 to 103 is a set of logic circuits (circuit group) comprising MOS transistors. A group of predetermined logic cones constitute a functional module, such as an arithmetic circuit, a memory circuit or the like. In FIG. 1, a plurality of functional modules are generally included in the semiconductor integrated circuit 100, though they are not particularly shown. Note that, in FIG. 1, CLK indicates a system clock, and each functional module is operated in synchronization with the system clock CLK.

Also, the logic cones 101 to 103 are operated in accordance with predetermined input signals (i.e., they are activated in accordance with the predetermined input signals). Specifically, the logic cone 101 is activated when an input signal SN0 is at the high level (hereinafter referred to as the H level). The logic cone 102 is activated when a signal SN1 output by the logic cone 101 is at the H level. The logic cone 103 is activated when a signal SN2 output by the logic cone 102 is at the H level. Thus, the logic cones 101 to 103 are serially connected so that an output signal of the previous logic cone is propagated to the next logic cone, whereby the activated state of each logic cone is transitioned. Since the functional module is operated in synchronization with the system clock CLK as described above, the activated state of the logic cone included in the functional module is transitioned even within one cycle of the system clock CLK. Note that the signals, such as the signal SN0 and the like, are logic signals which are obtained as results of operations of the respective logic cones (e.g., a result obtained partway through an operation, etc.), and therefore, do not need to be signals which are used only to activate circuits, such as, for example, a standby signal.

Also, the logic cones 101 to 103 have a structure in which the substrates thereof are isolated from each other, so that the threshold potentials of the MOS transistors included in the logic cones can be controlled in units of logic cones. Specifically, for example, the threshold potential can be controlled in units of logic cones using a chip structure shown in FIG. 2, 3 or 4.

Figure 2:
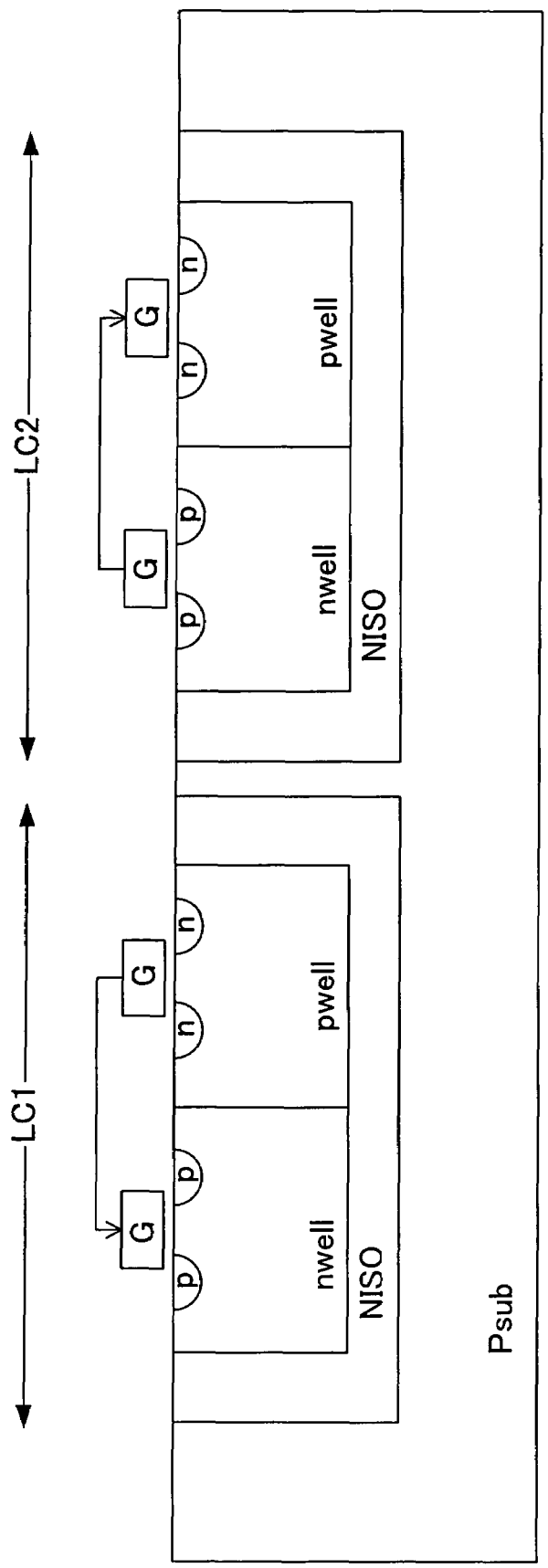
FIG. 2 is a diagram showing an exemplary chip structure of a semiconductor integrated circuit which can control the threshold potential of a MOS transistor in units of logic cones.

The chip structure of FIG. 2 is a triple-well structure. In this structure, a P-channel MOS transistor (hereinafter represented by PMOSTr) is comprised of a P-diffusion layer p and an N-well (nwell), and an N-channel MOS transistor (hereinafter represented by NMOSTr) is comprised of an N-diffusion layer n and a P-well (pwell). The substrates of the transistors are the nwell and the pwell, respectively. A substrate bias VBP1 for the PMOSTr is supplied to the nwell, while a substrate bias VBN1 for the NMOSTr is supplied to the pwell. In order to give different substrate biases to the two logic cones (LC1, LC2), an N-isolation layer NISO is provided below the well layer. In the semiconductor integrated circuit having such a structure, the threshold potential of the MOS transistor can be controlled in units of logic cones by controlling the substrate bias of a P-wafer substrate Psub.

Figure 3:
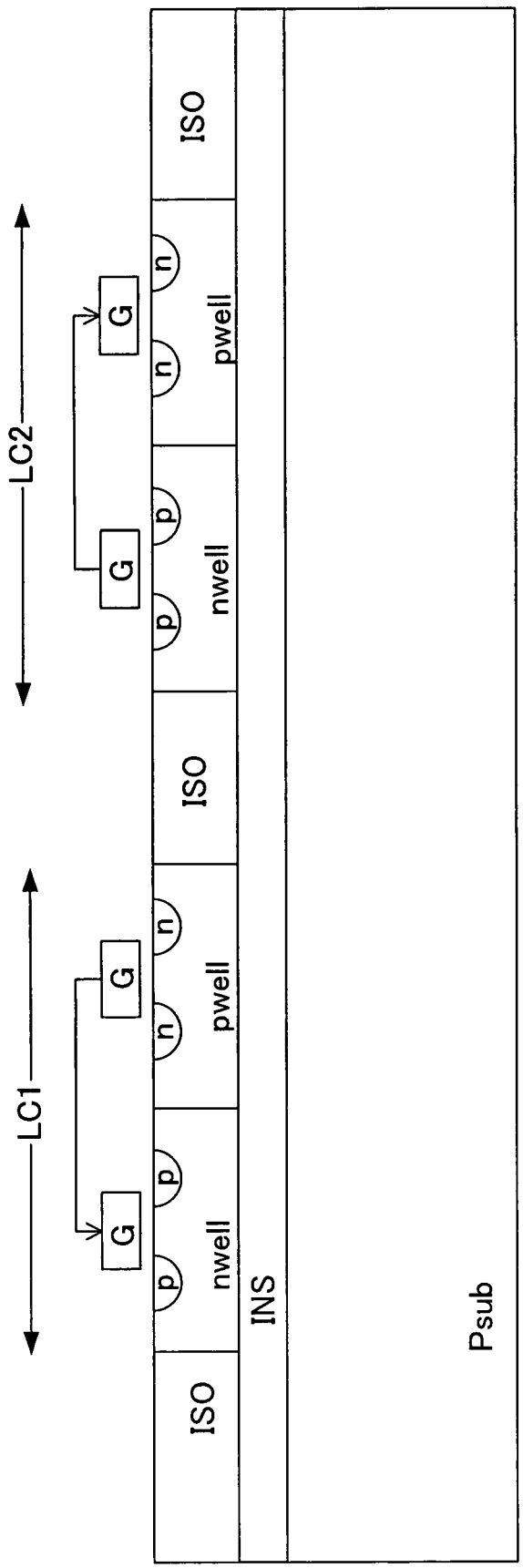
FIG. 3 is a diagram showing another exemplary chip structure of a semiconductor integrated circuit which can control the threshold potential of a MOS transistor in units of logic cones.

Also, FIG. 3 shows an exemplary chip having an SOI (Silicon On Insulator) structure. In this structure, an insulating layer INS made of an oxide film is formed on a surface of the P-wafer substrate Psub, and MOS transistors are configured on the insulating layer INS. The logic cones LC1 and LC2 are isolated from each other by an insulating isolation layer INS on the substrate. By using this structure, the substrate capacitance of the logic cone to be subjected to a substrate bias control can be reduced. Therefore, the threshold potential of the MOS transistor can be controlled by more easily controlling the substrate bias of each logic cone.

Figure 4:
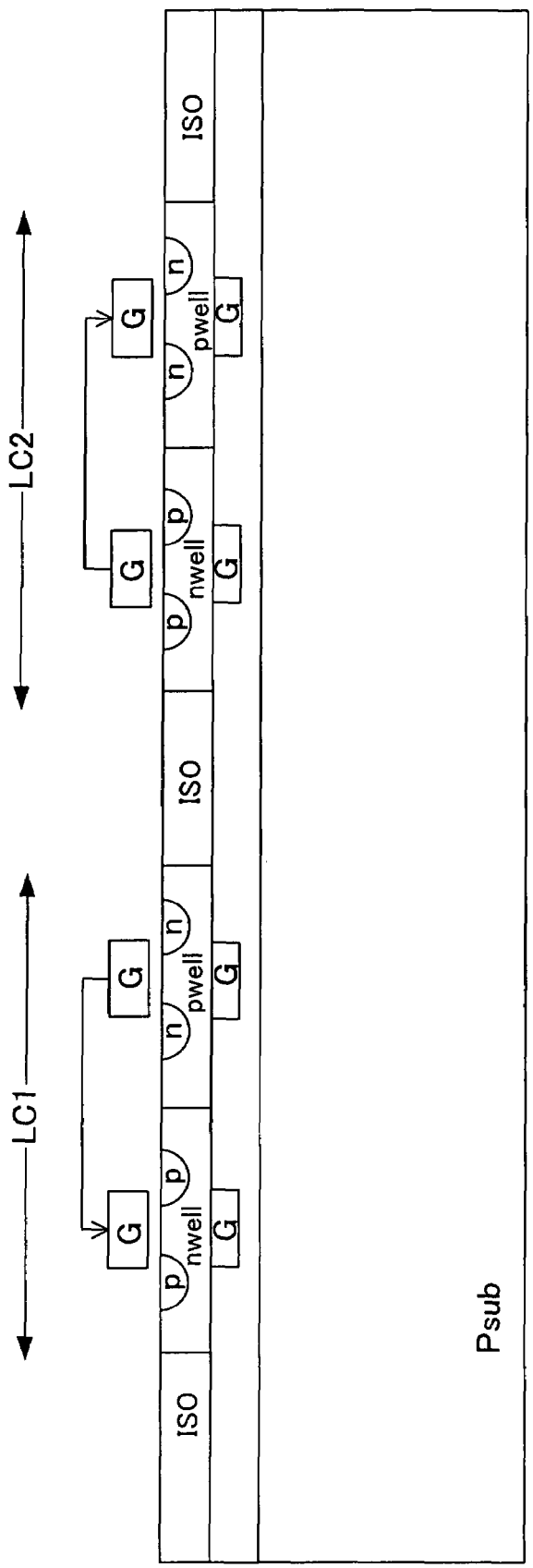
FIG. 4 is a diagram showing another exemplary chip structure of a semiconductor integrated circuit which can control the threshold potential of a MOS transistor in units of logic cones by controlling the potential of the back gate.

Also, FIG. 4 shows an exemplary chip comprising MOS transistors having a so-called double-gate structure. The MOS transistor, which is formed on a surface of a semiconductor substrate, has a structure in which source and drain regions formed on the semiconductor substrate surface, and an ordinary gate electrode formed via an insulating film, and in addition, a back gate provided between the source and drain regions, are provided. By applying a bias to the back gate, the threshold potential of the MOS transistor can be controlled. In other words, the threshold control of the MOS transistor can be controlled in units of logic cones in a manner similar to that in which the substrate bias is controlled. Although this figure shows a two-dimensional double-gate structure, the threshold potential control can be similarly performed even in a so-called Fin-FET structure which is a three-dimensional double-gate structure.

In Embodiment 1, an example will be described in which the threshold potential of the MOS transistor is controlled by controlling the substrate potential in a semiconductor integrated circuit having the chip structure of FIG. 3 or 4.

The substrate supply potential switching section 110 comprises a switch control circuit 111 and switch circuits 112 and 113, and supplies a substrate potential from any of a first substrate supply line and a second substrate supply line to the logic cone 102 in accordance with an input trigger signal. Note that the first substrate supply line has the same potential as the source potential of the MOS transistor of the logic cone, while the potential of the second substrate supply line is designed to supply a substrate potential (forward bias) which is shallower than the potential of the first substrate supply line.

The switch control circuit 111 turns the switch circuit 113 OFF and the switch circuit 1120N to supply the potential of the first substrate supply line to the logic cone 102 when the input trigger signal (signal SN1) is at the low level (hereinafter referred to as the L level), and turns the switch circuit 113 ON and the switch circuit 112 OFF to supply the potential of the second substrate supply line to the logic cone 102 when the input trigger signal is at the H level.

Also, the switch control circuit 111, when a predetermined time has passed since the forward bias supplying state (where the switch circuit 113 is ON), turns the switch circuit 113 OFF and the switch circuit 112 back to ON. The "predetermined time" is set in view of a time required to complete the signal propagation in the logic circuits of the logic cone 102.

The switch circuit 112 is a switch connected between a substrate supply node (described below) of the logic cone 102 and the first substrate supply line, and the ON/OFF thereof is controlled by the switch control circuit 111. Here, the substrate supply node is indicated by BBN1 in FIG. 1 and is connected with the nwells and the pwells in FIG. 2.

The switch circuit 113 is a switch connected between the substrate supply node of the logic cone 102 and the second substrate supply line, and the ON/OFF thereof is controlled by the switch control circuit 111.

The switch control circuit 111 and the switch circuits 112 and 113 are specifically comprised of MOS transistors. The ON/OFF of the switch circuits 112 and 113 is controlled by controlling the voltage of the gate electrode of the MOS transistor.

The substrate supply potential switching section 120 has the same configuration as that of the substrate supply potential switching section 110, and receives the signal SN2 as a trigger signal instead of the signal SN1 which is input to the substrate supply potential switching section 110, and supplies a substrate potential from any of the first substrate supply line and the second substrate supply line to a substrate supply node (BBN2 in FIG. 1) of the logic cone 103.

Specifically, the substrate supply potential switching section 120 comprises a switch control circuit 121 and switch circuits 122 and 123. The switch control circuit 121 and the switch circuits 122 and 123 correspond to the switch control circuit 111 and the switch circuits 112 and 113 of the substrate supply potential switching section 110, respectively.

Note that, by appropriately setting a relationship between the size of the logic cone and the substrate potential supply performance of the substrate supply potential switching sections 110 and 120, the transition time of the substrate potential of each logic cone can be adjusted. In other words, the substrate potential can be controlled without hindering the high speed of the logic cones 101 to 103.

(Operation of Semiconductor Integrated Circuit 100)

An operation of the semiconductor integrated circuit 100 will be described with reference to a timing chart of FIG. 5.

Figure 5:
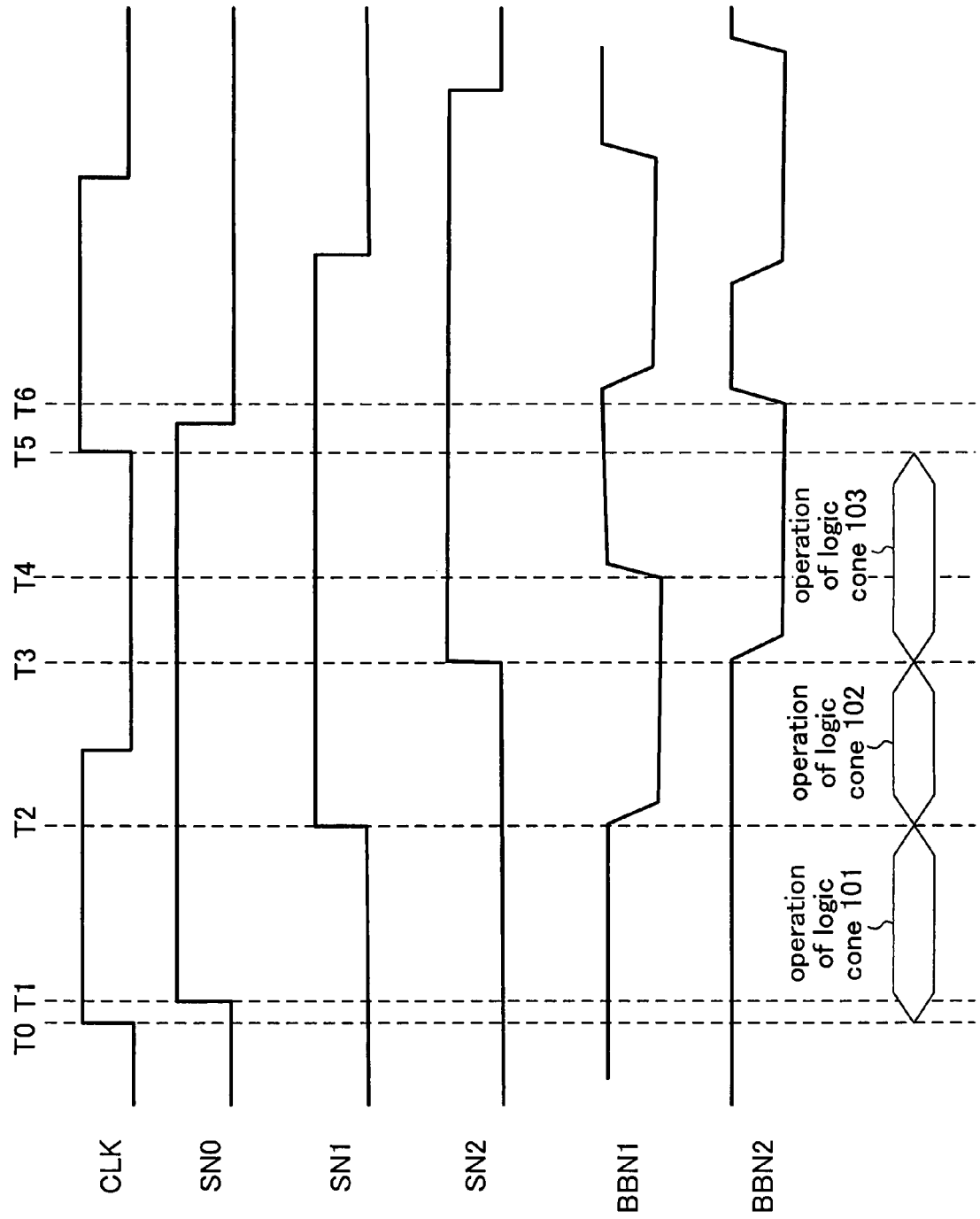
FIG. 5 is a timing chart showing an active state of the semiconductor integrated circuit of Embodiment 1.

At time T0 in FIG. 5, the signals SN0, SN1 and SN2 which are input to the logic cones 101 to 103, respectively, are at the L level, i.e., each logic cone is in the inactive state. Also, in an initial state until time T2, the potential of the first substrate supply line (the same potential as the source potential of the MOS transistor in the logic cone 102) is supplied as the substrate potential of the logic cone 102 via the substrate supply potential switching section 110.

When the signal SN0 goes to the H level at time T1, the logic circuit in the logic cone 101 performs a predetermined operation. As a result, at time T2, the signal SN1 output by the logic cone 101 goes to the H level. Thereby, the switch circuits 112 and 113 are switched to select the potential of the second substrate supply line, so that a so-called forward body bias which is a substrate bias shallower than the potential of the first substrate supply line is supplied to the logic cone 102. When the forward bias is supplied to the substrate, the threshold potential of the MOS transistor included in the logic cone 102 is reduced, thereby making it possible to achieve a high-speed operation.

Next, by the logic circuit of the logic cone 102 performing a predetermined operation, the signal SN2 output by the logic cone 102 goes to the H level at time T3. Thereby, the switch circuits 122 and 123 are switched to select the second substrate supply line, so that the forward body bias is supplied to the substrate supply node BBN2 of the logic cone 103. When the forward body bias is supplied to the substrate supply node BBN2, the logic cone 103 can perform an operation with high speed.

At time T4 when a predetermined time has passed since the transition of the signal SN1, the switch control circuit 111 switches the switch circuits 112 and 113 again to select the first substrate supply line. Thereby, the same potential as the source potential of the MOS transistor in the logic cone 102 is supplied to the substrate supply node BBN1, so that the threshold potential of the MOS transistor becomes larger than when the forward bias is supplied to the substrate. Thereby, the subthreshold current (leakage current) of the MOS transistor included in the logic cone 102 is reduced.

When the threshold voltage is large, the logic circuit in the logic cone 102 cannot perform a high-speed operation, but the operation (signal propagation) of the logic circuit in the logic cone 102 is completed. In other words, the logic cone 102 only needs to hold data, and there is not a problem with the lack of a high-speed operation.

At time T6 when a predetermined time has passed since the transition of the signal SN2, the switch control circuit 121 similarly switches the switch circuits 122 and 123 again to select the first substrate supply line. Thereby, the leakage current is reduced in the logic cone 103.

As described above, according to this embodiment, since the threshold potential is controlled in units of logic cones, the power consumption can be more finely controlled than when the power consumption is controlled in units of functional modules. Specifically, the power consumption of a logic cone (logic circuits) which is not operated in a functional module can be reduced while a high-speed operation is achieved.

Note that, in this embodiment, the substrate bias takes two different potential states as described above. Therefore, for example, when the potential of the first substrate supply line is −Vdd and the potential of the second substrate supply line is 2Vdd, a voltage range of as large as 3Vdd needs to be controlled in the substrate supply potential switching sections 110 and 120.

Typically, the logic cone is used with a voltage between the power source voltage Vdd and the ground potential GND, and therefore, a transistor made of a gate insulating film having a thin thickness is used (hereinafter such a transistor is referred to as a "thin-film transistor"). Therefore, when a circuit (the switch control circuit 111, the switch circuit 112, etc.) for controlling the substrate bias is operated with a voltage range of as wide as 3Vdd as described above, the voltage may exceed the breakdown voltage of the thin-film transistor, leading to destruction of the gate insulating film or the junction portion of the transistor.

Therefore, in such a case, for the circuit for controlling the substrate bias, it is necessary to use a MOS transistor made of a gate insulating film thicker than the thin-film transistor used in the logic cone (such a transistor is referred to as a "thick-film transistor").

Specifically, in this embodiment, if the switch control circuit 111 and the switch circuits 112 and 113 included in the substrate supply potential switching section 110 and the switch control circuit 121 and the switch circuits 122 and 123 included in the substrate supply potential switching section 120 are configured with thick-film transistors, a circuit configuration which can be guaranteed to withstand a wide voltage range is obtained. Note that the switch control circuit 121 can be configured to withstand 2Vdd if the circuit which outputs 2Vdd is separated from the circuit which outputs −Vdd so that a bias of as high as 3Vdd is not applied to the gate. In other words, the switch control circuit 121 can be comprised of a transistor having a gate insulating film thinner than that of the switch circuits 122 and 123.

Also, in this embodiment, for the sake of simplicity, it has been described that there are two substrate supply lines to the logic cone (i.e., the first substrate supply line and the second substrate supply line). However, when the logic circuit is configured with CMOS, the substrate potentials of a P-channel MOS transistor (hereinafter represented by PMOSTr) and an N-channel MOS transistor (hereinafter represented by NMOSTr) can be separately controlled. In this case, a pair of the first substrate supply line and the second substrate supply line may be provided for each of NMOSTr and PMOSTr.

Embodiment 2 of the Invention

Figure 6:
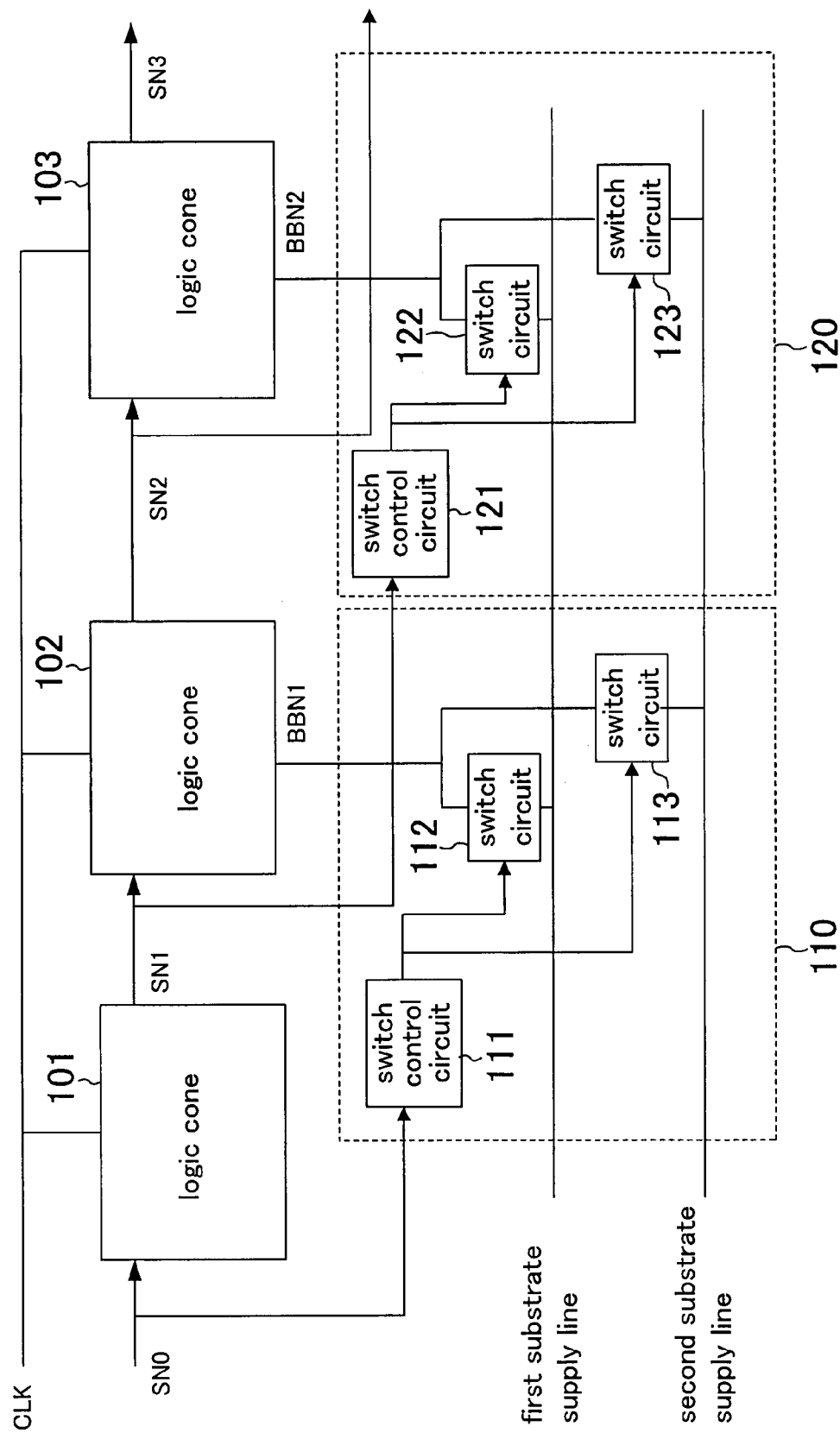
FIG. 6 is a block diagram showing a configuration of a semiconductor integrated circuit according to Embodiment 2 of the present invention.

FIG. 6 is a block diagram showing a configuration of a semiconductor integrated circuit 200 according to Embodiment 2 of the present invention.

As shown in FIG. 6, the semiconductor integrated circuit 200 is different from the semiconductor integrated circuit 100 of Embodiment 1 in trigger signals input to the substrate supply potential switching section 110 and the substrate supply potential switching section 120. Specifically, in the semiconductor integrated circuit 200, the signal SN0 is input as a trigger signal to the input substrate supply potential switching section 110 instead of the signal SN1. Also, the signal SN1 is input as a trigger signal to the input substrate supply potential switching section 120 instead of the signal SN2.

Figure 7:
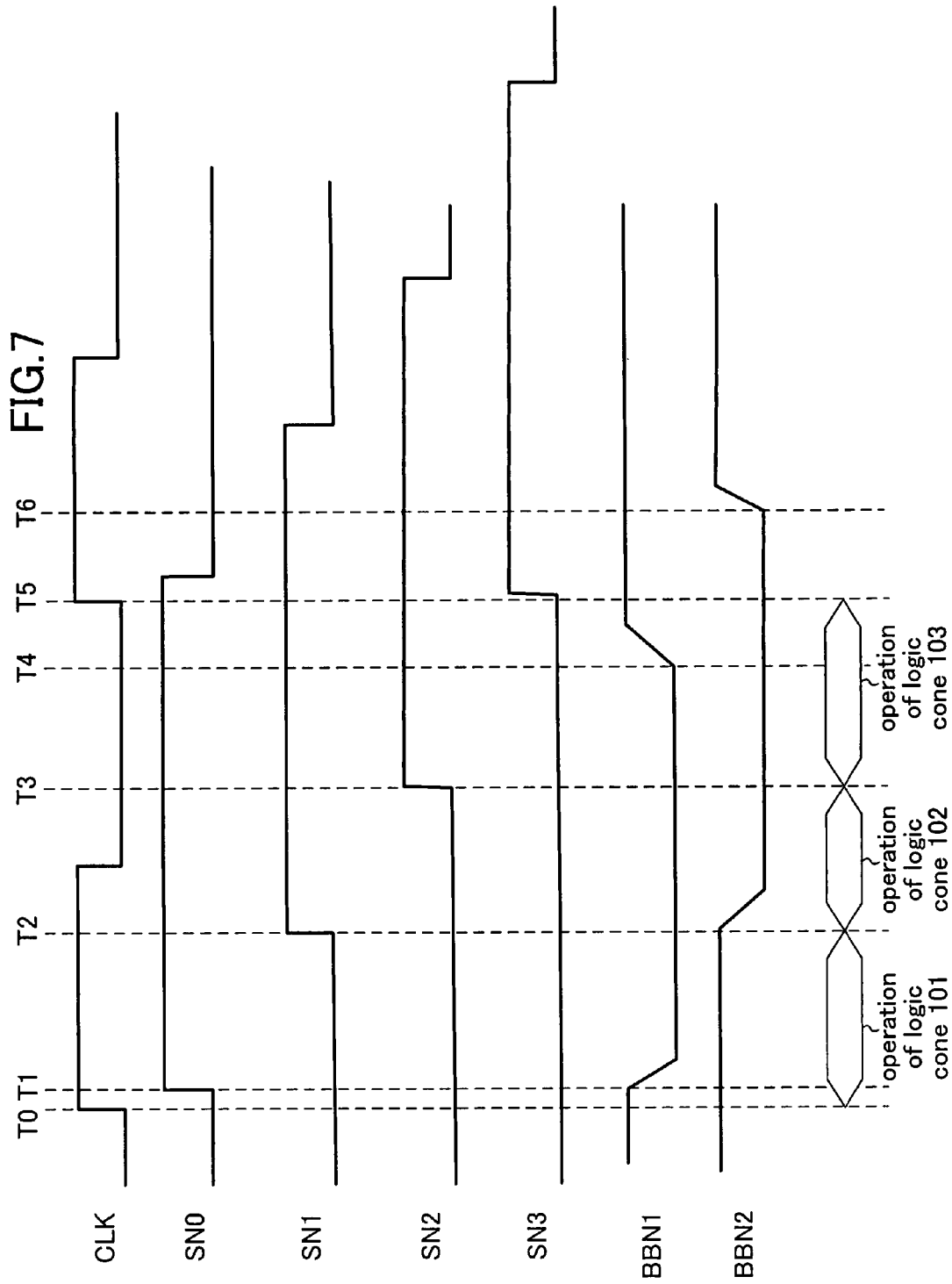
FIG. 7 is a timing chart showing an active state of the semiconductor integrated circuit of Embodiment 2.

An operation of the semiconductor integrated circuit 200 will be described with reference to a timing chart of FIG. 7. In FIG. 7, at time T0, the signals SN0, SN1 and SN2 which are input to the logic cones 101 to 103, respectively, are at the L level, so that each logic cone is in the inactive state. Also, in an initial state until time T1, the potential of the first substrate supply line (the same potential as the source potential of the MOS transistor in the logic cone 102) is selected as the substrate potential of the logic cone 102 by the substrate supply potential switching section 110.

When the signal SN0 goes to the H level at time T1, the switch circuits 112 and 113 are switched to select the second substrate supply line. Thereby, a so-called forward body bias is supplied as a substrate potential to the substrate supply node BBN1. When the forward bias is supplied to the substrate, the threshold potential of the MOS transistor included in the logic cone is reduced, thereby making it possible to achieve a high-speed operation.

When the logic circuit in the logic cone 101 performs a predetermined operation in accordance with the transition of the signal SN0, the signal SN1 which is an input to the logic cone 102 goes to the H level at time T2.

By the transition of the signal SN1 to the H level at time T2, the switch circuits 122 and 123 are switched to select the second substrate supply line. Thereby, the forward body bias is supplied to the substrate node BBN2, so that the logic cone 103 can perform an operation with high speed.

Next, when the logic circuit in the logic cone 102 performs a predetermined operation, the signal SN2 which is input to the logic cone 103 goes to the H level at time T3.

Thereafter, at time T4 when a predetermined time has passed since the transition of the signal SN1, the control signals to the switch circuits 112 and 113 output from the switch control circuit 111 are switched again to select the first substrate supply line. Thereby, the same potential as the source potential of the MOS transistor is supplied to the substrate node BBN1, so that the threshold potential of the MOS transistor becomes larger than when the forward bias is supplied to the substrate. Thereby, the subthreshold leakage current of the MOS transistor included in the logic cone 102 is reduced.

When the threshold voltage is large, the logic circuit in the logic cone 102 cannot perform a high-speed operation, but the signal propagation of the logic circuit in the logic cone 102 is completed. In other words, the logic cone 102 only needs to hold data, and there is not a problem with the lack of a high-speed operation.

Similarly, at time T6, the switch control circuit 121 switches the switch circuits 122 and 123 again to select the first substrate supply line. Thereby, the logic cone 103 goes to a state in which the leakage current is small (low leakage state).

As described above, according to this embodiment, a signal input to a logic cone previous to a logic cone whose substrate potential is to be controlled is used as a trigger signal for the switch control circuit, thereby making it possible to control the threshold potential before the logic cone is actually operated. Therefore, even when the logic cone has a small scale and the operation of the logic cone is more quickly ended, the threshold potential can be controlled before completion of the operation. In other words, this embodiment is suitable for a case where the threshold is desired to be more finely controlled by further reducing the scale of the logic cone.

Embodiment 3 of the Invention

Figure 8:
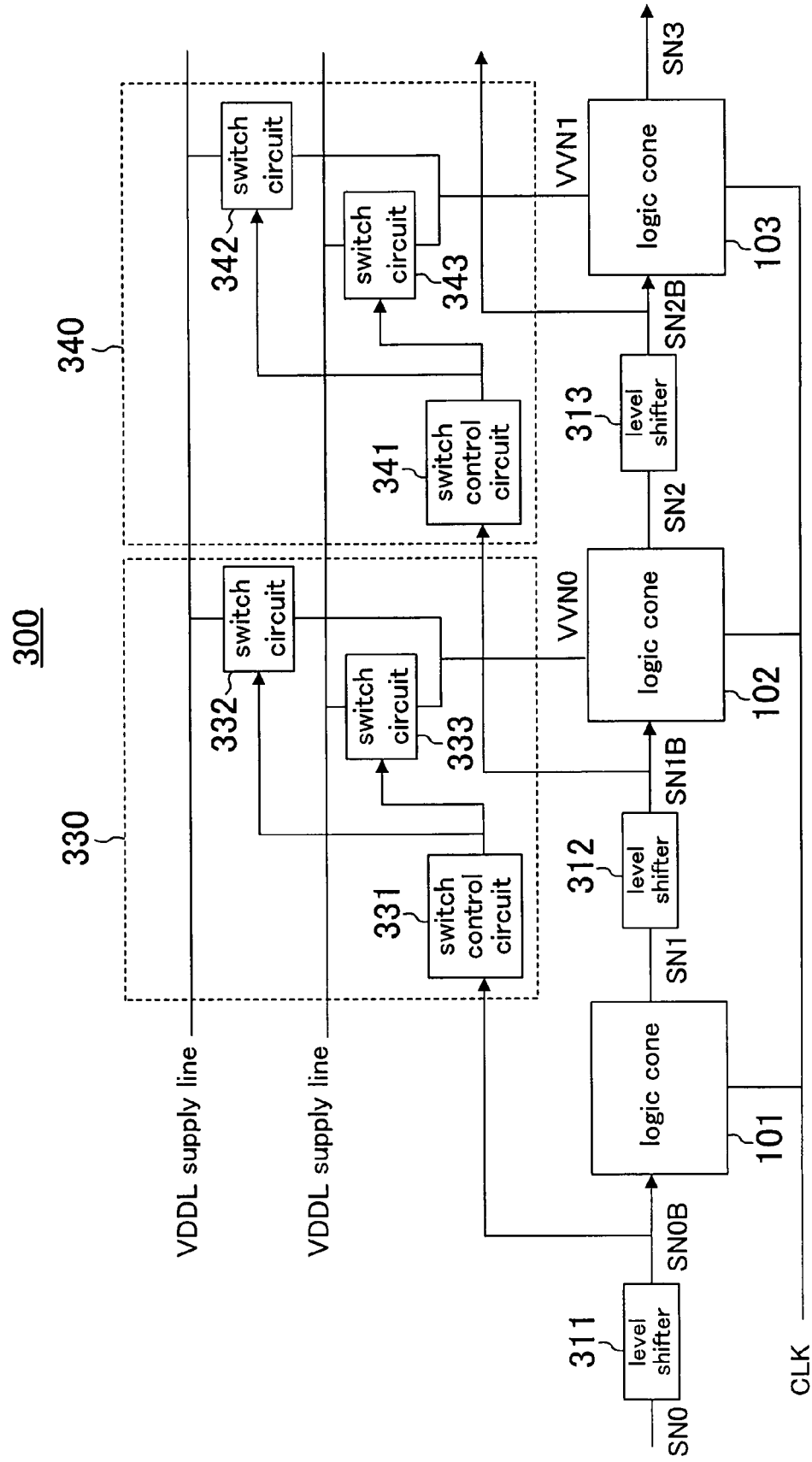
FIG. 8 is a block diagram showing a configuration of a semiconductor integrated circuit according to Embodiment 3 of the present invention.

FIG. 8 is a block diagram showing a configuration of a semiconductor integrated circuit 300 according to Embodiment 3 of the present invention. As shown in FIG. 8, the semiconductor integrated circuit 300 comprises logic cones 101 to 103, level shifters 311 to 313, and power source supply potential switching sections 330 and 340.

The level shifter 311 converts a signal SN0 output by a logic cone (not shown) previous to the logic cone 101 into a voltage suitable for the operation of the logic cone 101, and outputs the resultant voltage as a signal SN1B to the logic cone 101 and the power source supply potential switching section 330.

The level shifter 312 outputs a signal (signal SN1B) which is obtained by converting the output of the logic cone 101 into a voltage suitable for the operation of the logic cone 102, to the logic cone 102 and the power source supply potential switching section 340.

The level shifter 313 outputs a signal (signal SN2B) which is obtained by converting the output of the logic cone 102 into a voltage suitable for the operation of the logic cone 103, to the logic cone 103 and a power source supply potential switching section (not shown) subsequent to the logic cone 103.

The power source supply potential switching section 330 comprises a switch control circuit 331 and switch circuits 332 and 333, and supplies a power source potential from any of a VDDH supply line and a VDDL supply line to the logic cone 102 in accordance with an input trigger signal (signal SN0B).

Note that a potential which is supplied from the VDDH supply line is lower than a potential which is supplied from the VDDL supply line.

The switch control circuit 331 turns the switch circuit 333 OFF and the switch circuit 332 ON to supply the potential of the VDDL supply line to the logic cone 102 when the input trigger signal (signal SNOB) is at the L level, and turns the switch circuit 333 ON and the switch circuit 332 OFF to supply the potential of the VDDH supply line to the logic cone 102 when the input trigger signal is at the H level.

Also, the switch control circuit 331, when a predetermined time has passed since the state in which the potential of the VDDH supply line is supplied (where the switch circuit 333 is ON), turns the switch circuit 333 OFF and the switch circuit 332 back to ON. Thus, a time at which the state of the switch is turned back is set in view of a time at which the signal propagation of the logic circuit in the logic cone 102 is completed.

The switch circuit 332 is a switch which is connected between a power source supply node (VVN0 in FIG. 8) of the logic cone 102 and the VDDL supply line, and the ON/OFF thereof is controlled by the switch control circuit 331 as described above. Also, the switch circuit 333 is a switch which is connected between the power source supply node of the logic cone 102 and the VDDH supply line, and the ON/OFF thereof is controlled by the switch control circuit 331.

The power source supply potential switching section 340 has the same configuration as that of the power source supply potential switching section 330. The power source supply potential switching section 340 receives the signal SN1B instead of the signal SNOB which is input in the power source supply potential switching section 330, and the power source potential of any of the VDDH supply line and the VDDL supply line is supplied to a power source supply node (WN1 of FIG. 8) of the logic cone 103.

Specifically, the power source supply potential switching section 340 comprises a switch control circuit 341 and switch circuits 342 and 343. The switch control circuit 341 and the switch circuits 342 and 343 correspond to the switch control circuit 331 and the switch circuits 332 and 333 of the power source supply potential switching section 330, respectively.

(Operation of Semiconductor Integrated Circuit 300)

An operation of the semiconductor integrated circuit 300 will be described with reference to a timing chart of FIG. 9.

Figure 9:
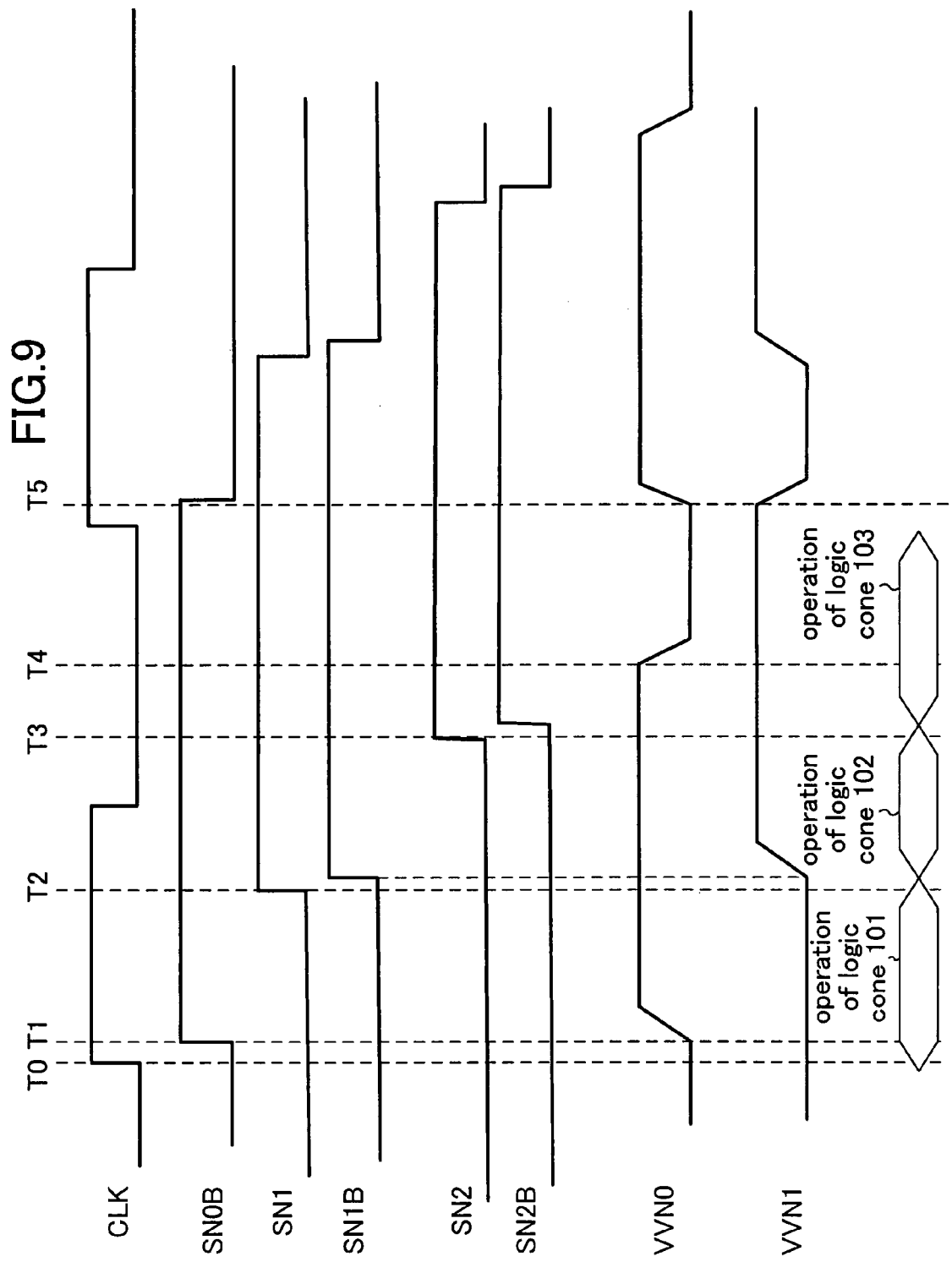
FIG. 9 is a timing chart showing an active state of the semiconductor integrated circuit of Embodiment 3.

In FIG. 9, at time T0, since the signals SN0B, SN1B and SN2B which are input to the logic cones 101 to 103, respectively, are at the L level, each logic cone is in the inactive state. Also, in an initial state until time T1, the power source potential of the VDDL supply line is supplied.

Figure 10:
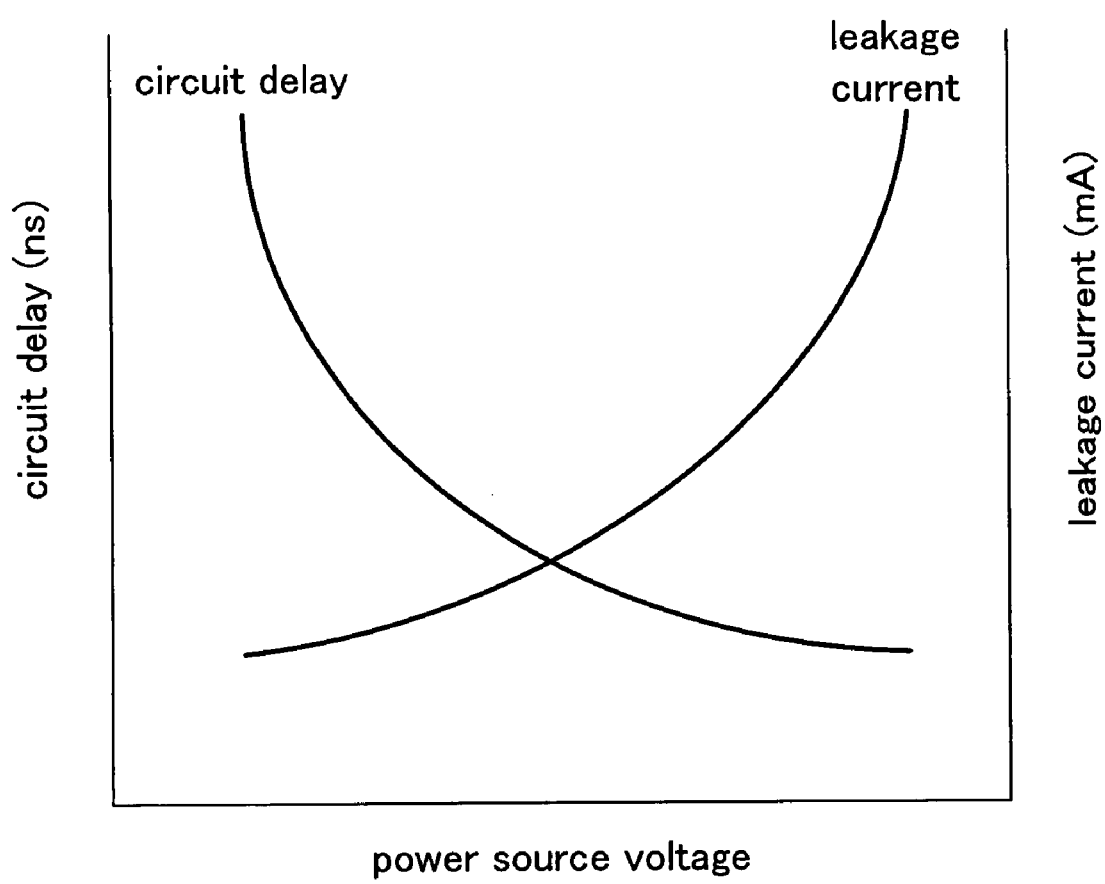
FIG. 10 is a diagram showing a relationship between a power source potential to a MOS transistor and a circuit delay, and a relationship between the power source potential and a leakage current.

Here, a relationship between the power source potential of the MOS transistor and a circuit delay, and a relationship between the power source potential and the leakage current are shown in FIG. 10. As shown in FIG. 10, if the supplied potential is increased, the delay time decreases, though the leakage current increases. Conversely, if the supplied potential is decreased, the delay time increases, though the leakage current decreases. In other words, when the power source potential of the VDDH supply line is supplied, the leakage current is larger than when the power source potential of the VDDL supply line is supplied, but a high-speed operation can be performed.

When SN0B goes to the H level at time T1, the switch circuits 332 and 333 are switched, so that the power source potential of the VDDH supply line is supplied to the logic cone 102.

Thereafter, when the logic circuit in the logic cone 101 performs a predetermined operation in accordance with the change of SNOB, the signal SN1 output by the logic cone 101 goes to the H level at time T2. The signal SN1 is converted by the level shifter 312 into a signal (signal SN1B) which is a voltage suitable for the logic cone 102, and is output to the switch control circuit 341 and the logic cone 102.

Thereby, the switch circuits 342 and 343 are switched, so that the power source potential of the VDDH supply line is supplied to the logic cone 103. When a potential higher than the VDDL supply line is supplied to the logic cone 103, the logic cone 103 can be operated with higher speed.

Next, when the logic circuit in the logic cone 102 performs a predetermined operation, the signal SN2 output by the logic cone 102 goes to the H level at time T3. The signal SN2 is converted by the level shifter 313 into a signal (signal SN2B) having a voltage suitable for the logic cone 103, and is output to the logic cone 103 and a power source supply potential switching section (not shown) subsequent to the logic cone 103.

Further, at time T4 when a predetermined time has passed since the transition of SN1, the switch circuits 332 and 333 are switched by the switch control circuit 331 again to supply the power source potential of the VDDL supply line. Thereby, the subthreshold current (leakage current) of the MOS transistor included in the logic cone 102 is reduced.

If the power source potential decreases, the logic circuit in the logic cone 102 cannot perform a high-speed operation, but the operation (signal propagation) of the logic circuit in the logic cone 102 is completed. In other words, the logic cone 102 only needs to hold data, and there is not a problem with the lack of a high-speed operation.

Similarly, at time T5, the switch circuits 342 and 343 are switched by the switch control circuit 341 again to supply the power source potential of the VDDL supply line to the logic cone 103. Thereby, the leakage current is reduced in the logic cone 103.

As described above, according to this embodiment, the power source potential is controlled in units of logic cones, so that the power consumption can be more finely controlled than when the power consumption is controlled in units of control functional modules. In other words, the power consumption of a logic cone (logic circuit) which is not operated in a functional module can be reduced while a high-speed operation is achieved.

In addition, a signal input to a logic cone previous to a logic cone whose substrate potential is to be controlled is used as a trigger signal for the switch control circuit, thereby making it possible to control the threshold potential before the logic cone is actually operated. Therefore, even when the logic cone has a small scale and the operation of the logic cone is more quickly ended, the threshold potential can be controlled before completion of the operation. In other words, this embodiment is suitable for a case where the threshold is desired to be more finely controlled by further reducing the scale of the logic cone.

Note that, in this embodiment, by providing a level shifter between each logic cone, a power source potential supplied from the VDDH supply line and a power source potential supplied from the VDDL supply line can be set to be any power source voltages. Alternatively, when the difference between these potentials is small, the level shifter may be removed.

Also, as a trigger signal, not only a signal output by the second previous logic cone but also a signal output by the immediately previous logic cone can be used, or alternatively, signals output by a plurality of logic cones can be used.

Embodiment 4 of the Invention

Figure 11:
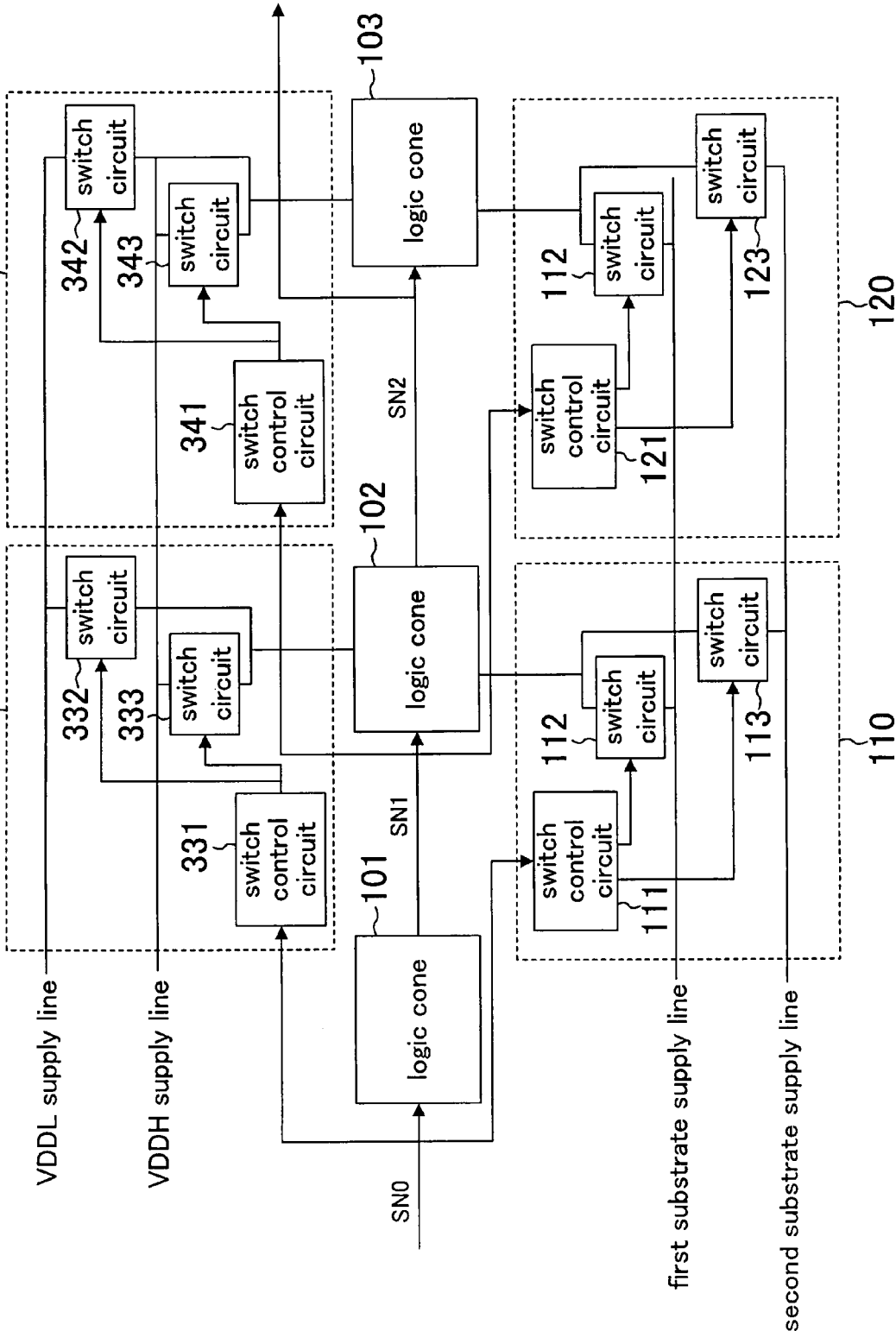
FIG. 11 is a block diagram showing a configuration of a semiconductor integrated circuit according to Embodiment 4 of the present invention.

FIG. 11 is a block diagram showing a configuration of a semiconductor integrated circuit 400 according to Embodiment 4 of the present invention. The semiconductor integrated circuit 400 is an exemplary semiconductor integrated circuit in which both the substrate potential of each logic cone and the power source potential are controlled.

As shown in FIG. 11, the semiconductor integrated circuit 200 and the semiconductor integrated circuit 300 are combined. Note that the semiconductor integrated circuit 400 is an example in which, since the difference in potential between the VDDH supply line and the VDDL supply line is small, the level shifters 311 to 313 are removed.

Figure 12:
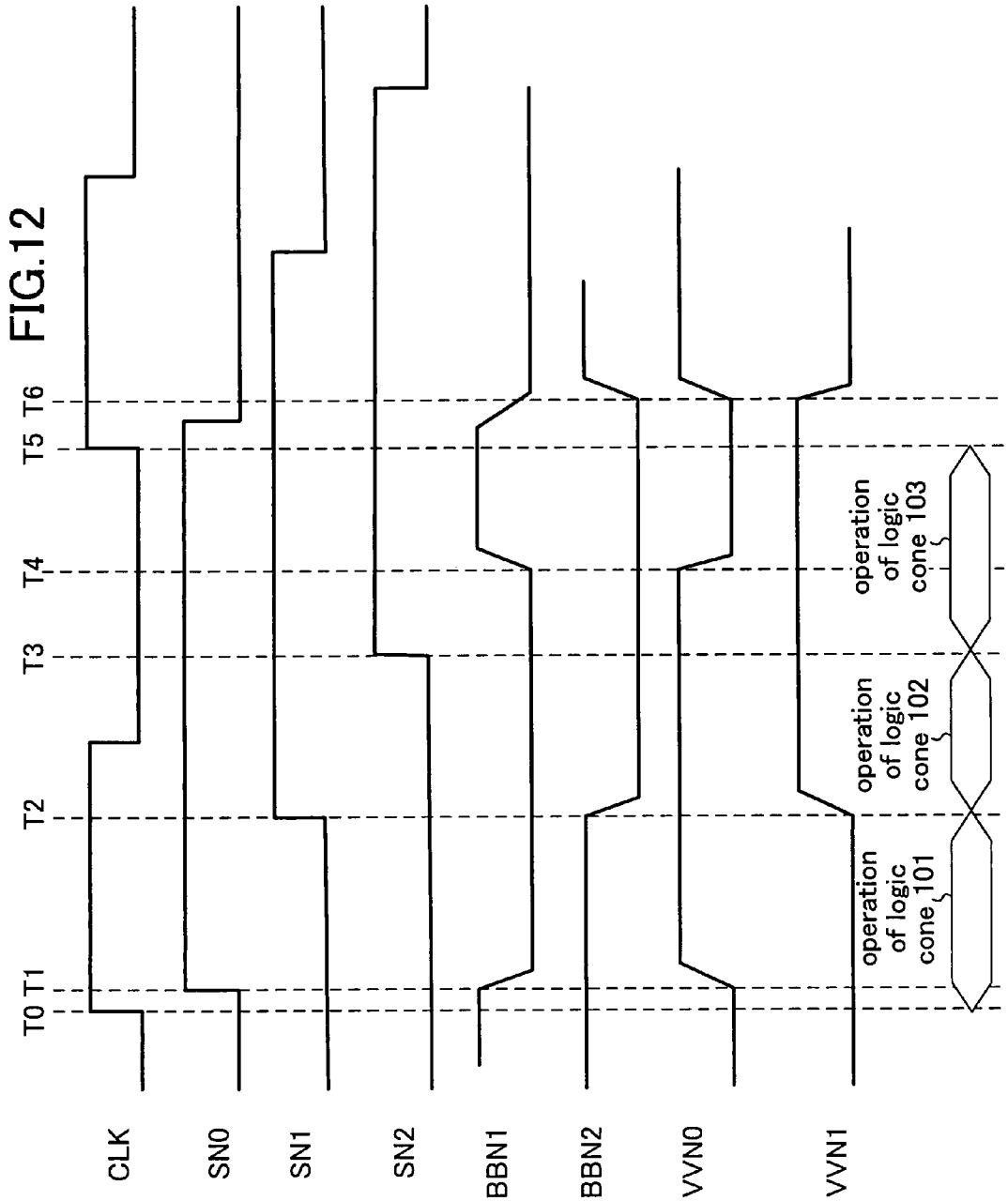
FIG. 12 is a timing chart showing an active state of the semiconductor integrated circuit of Embodiment 4.

In the semiconductor integrated circuit 400, the substrate potential and the power source potential of each logic cone are controlled as shown in a timing chart of FIG. 12. The timing of switching each switch circuit and the timing of transition of the substrate potential and the power source potential are similar to those in the semiconductor integrated circuits 200 and 300.

In general, assuming that the power source potential is the same, if the threshold potential of a transistor is decreased, the operating speed increases. In other words, during the operation of a logic cone, if the threshold potential is decreased, the operating speed can be maintained even when the power source potential is decreased to a predetermined potential. Therefore, in this embodiment, a potential which is lower than that of the semiconductor integrated circuit 300 of Embodiment 3 is supplied from the VDDH supply line, thereby making it possible to operate the semiconductor integrated circuit 400 with lower power consumption.

In other words, according to this embodiment, it is possible to obtain the effect of reducing power consumption to more extent than when the power consumption reducing effects of the semiconductor integrated circuit 200 and the semiconductor integrated circuit 300 are added together.

Embodiment 5

Figure 13:
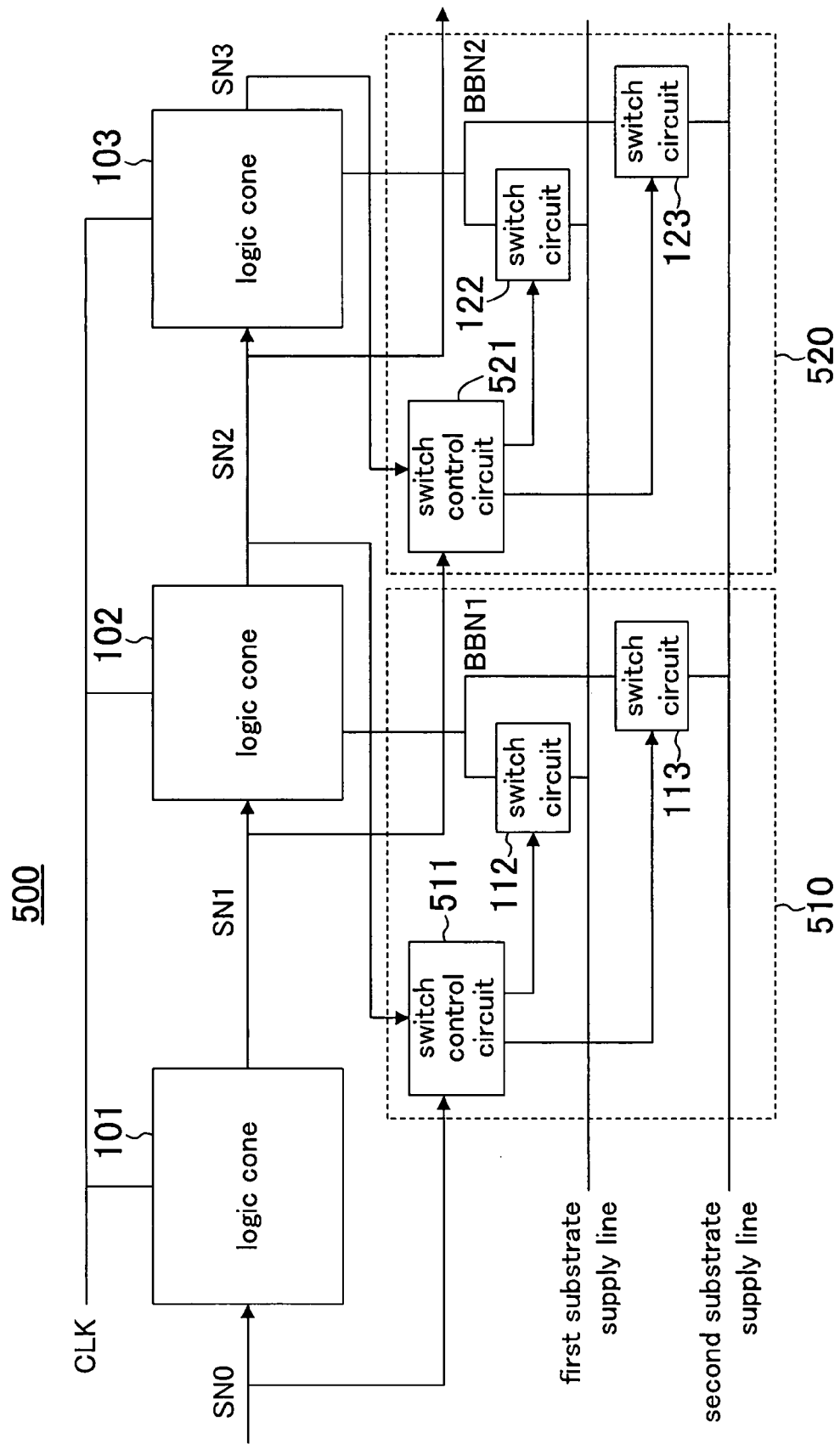
FIG. 13 is a block diagram showing a configuration of a semiconductor integrated circuit according to Embodiment 5 of the present invention.

FIG. 13 is a block diagram showing a configuration of a semiconductor integrated circuit 500 according to Embodiment 5 of the present invention. This embodiment is different from Embodiment 2 in a manner in which the timing of changing the substrate bias back to the original low leakage state after completion of an operation of the logic cone is controlled. Specifically, the semiconductor integrated circuit 500 comprises logic cones 101 to 103 and substrate supply potential switching sections 510 and 520 as shown in FIG. 13.

The substrate supply potential switching section 510 comprises switch circuits 112 and 113 and a switch control circuit 511, and supplies a substrate potential from any of the first substrate supply line and the second substrate supply line to the logic cone 102 in accordance with two input trigger signals (SN0 and SN2).

Specifically, the switch control circuit 511 turns switch circuit 113 OFF and the switch circuit 112 ON to supply the potential of the first substrate supply line to the logic cone 102 when the input trigger signal (signal SN0) is at the L level, and turns the switch circuit 113 ON and the switch circuit 112 OFF to supply the potential of the second substrate supply line to the logic cone 102 when the input trigger signal is at the H level.

Also, the switch control circuit 511 turns the switch circuit 113 OFF and the switch circuit 112 back to ON when a signal (SN2) output by a logic cone whose substrate potential is to be controlled (i.e., the logic cone 102) goes to the H level while the potential of the second substrate supply line is supplied (the switch circuit 113 is ON).

The substrate supply potential switching section 520 has the same configuration as that of the substrate supply potential switching section 510, and receives the signal SN1 instead of the signal SN0 which is input to the substrate supply potential switching section 510, and receives a signal SN3 instead of the signal SN2.

Specifically, the substrate supply potential switching section 520 comprises switch circuits 122 and 123 and a switch control circuit 521. The switch circuits 122 and 123 and the switch control circuit 521 correspond to the switch circuits 112 and 113 and the switch control circuit 511 of the substrate supply potential switching section 510, respectively.

Figure 14:
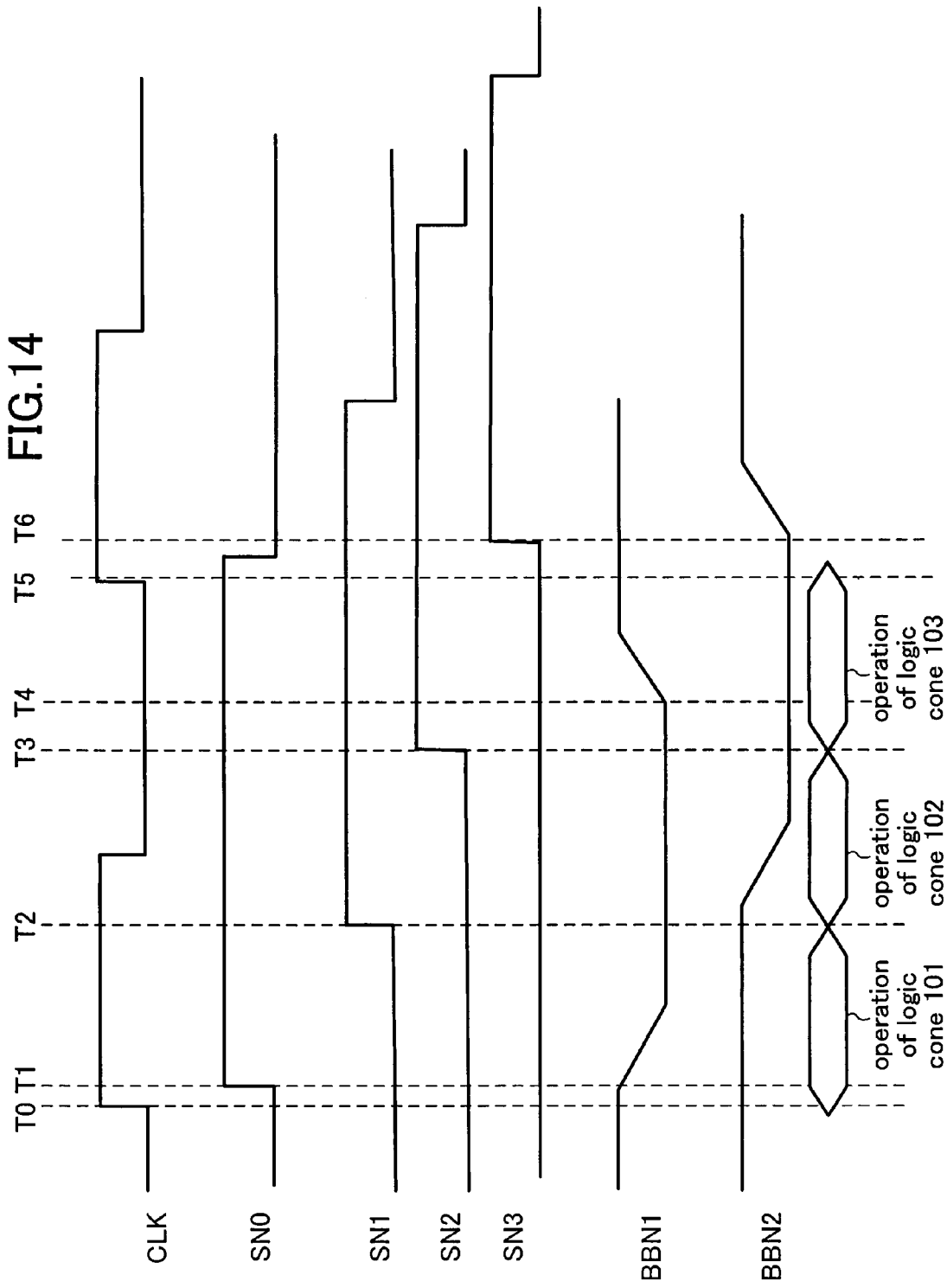
FIG. 14 is a timing chart showing an active state of the semiconductor integrated circuit of Embodiment 5.

The semiconductor integrated circuit 500 is controlled so that the substrate potential and the power source potential of each logic cone are as shown in a timing chart of FIG. 14.

Specifically, as in the semiconductor integrated circuit 200 of Embodiment 2, the forward bias is supplied from the second substrate supply line to the substrate of the logic cone 102 using the signal SN0 as a trigger. Thereby, the threshold potential of the MOS transistor included in the logic cone 102 is reduced, so that the logic cone 102 can perform a high-speed operation.

When the operation of the logic cone 102 is completed and the H-level signal SN2 is output, the switch control circuit 511 turns the switch circuit 112ON and the switch circuit 113 OFF. Thereby, the potential of the first substrate supply line (the same potential as the source potential of the MOS transistor) is supplied to the substrate node BBN1. Specifically, the threshold potential of the MOS transistor becomes larger than when the forward bias is supplied to the substrate, so that the subthreshold current of the MOS transistor included in the logic cone 102 is reduced.

Similarly, in the logic cone 103, when the operation is completed and the H-level signal SN3 is output, the potential of the first substrate supply line is supplied by the substrate supply potential switching section 520, resulting in a reduction in the subthreshold current.

As described above, in Embodiments 1 to 4, since a time when the operation of the logic cone is completed with certainty is previously estimated to determine the timing of returning to the low leakage state, it is necessary to provide a sufficient margin for the time until the substrate potential is returned. However, according to this embodiment, since the substrate potential is changed back to the low leakage state based on a signal obtained as a result of the operation of the logic cone, the transition to the low leakage state can be performed with higher speed, thereby making it possible to achieve a semiconductor integrated circuit which is stable without the possibility of occurrence of an error operation.

Note that, also in this embodiment, the power source potential may be controlled instead of the substrate potential, or both the substrate potential and the power source potential may be controlled.

Embodiment 6

Figure 15:
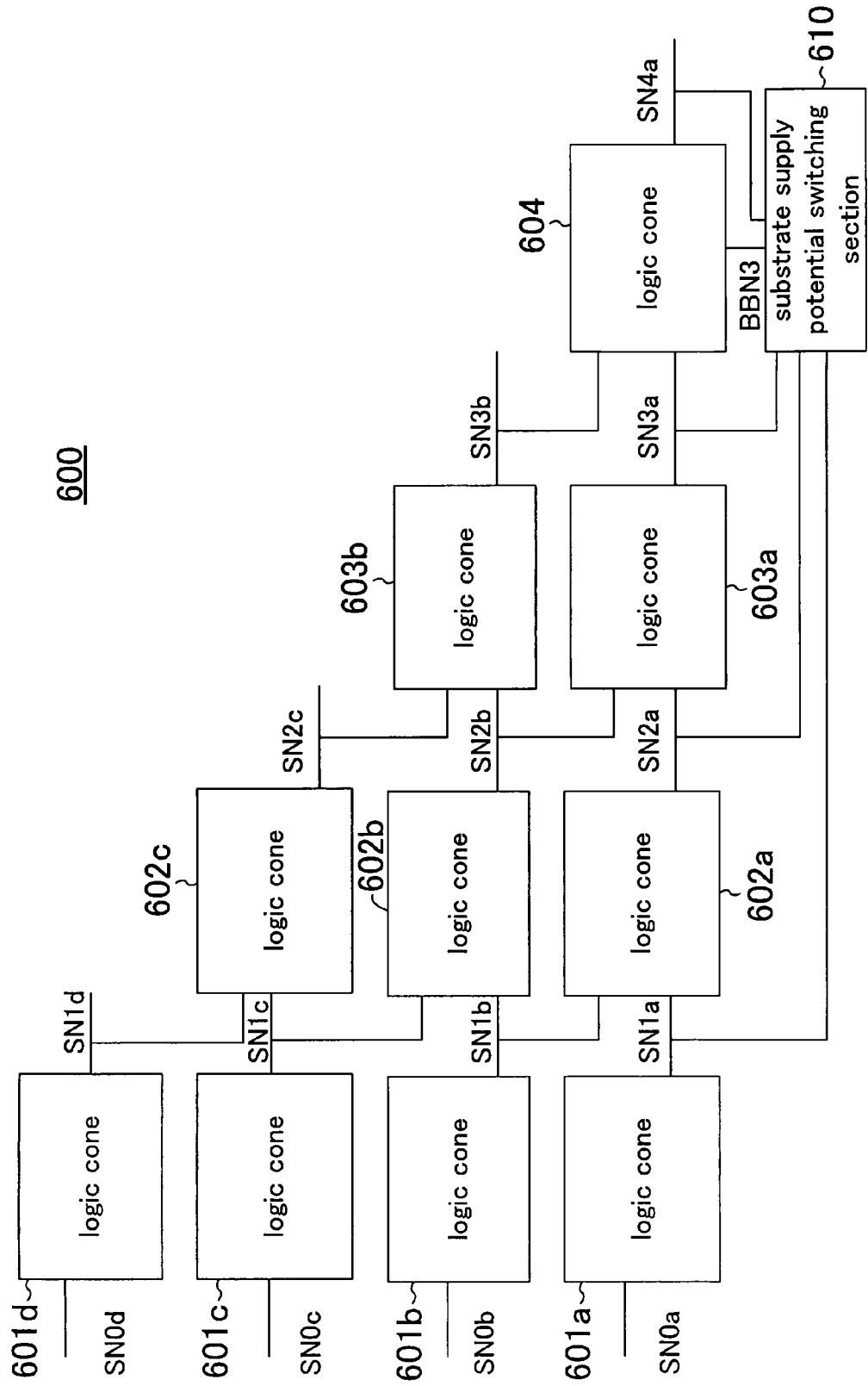
FIG. 15 is a block diagram showing a configuration of a semiconductor integrated circuit according to Embodiment 6 of the present invention.

FIG. 15 is a block diagram showing a configuration of a semiconductor integrated circuit 600 according to Embodiment 6 of the present invention. As shown in FIG. 15, the semiconductor integrated circuit 600 comprises logic cones 601a to 601d, 602a to 602c, 603a and 603b, and 604, and a substrate supply potential switching section 610.

Each logic cone is a group (circuit group) of logic circuits which are similar to those of the logic cone 101 of Embodiment 1 or the like, whose input and output are connected as shown in FIG. 15. For example, the logic cone 602a is operated in accordance with transition from the L level to the H level of a signal SN1a output by the logic cone 601a and a signal SN1b output by the logic cone 601b. Also, the logic cone 603a is operated in accordance with transition from the L level to the H level of a signal SN2a output by the logic cone 602a and a signal SN2b output by the logic cone 602b. Also, the logic cone 604 is operated in accordance with transition from the L level to the H level of a signal SN3a output by the logic cone 603a and a signal SN3b output by the logic cone 603b.

In other words, when the signal SN1a goes to the H level, a probability that the logic cone 604 is operated increases, and when the SN2a goes to the H level, the probability further increases.

The substrate supply potential switching section 610 receives three trigger signals (first to third trigger signals), and controls the substrate potential of the logic cone 604 in accordance with the transition of the received trigger signals. Specifically, the substrate supply potential switching section 610 lowers the substrate potential to V1 when the first trigger signal goes to the H level, lowers the substrate potential to V2 when the second trigger signal goes to the H level, and lowers the substrate potential to V3 when the third trigger signal goes to the H level. Note that V1>V2>V3.

In this embodiment, the signals SN1a, SN2a and SN3a are input as the first, second and third trigger signals, respectively, to the substrate supply potential switching section 610.

Also, the substrate supply potential switching section 610 changes the substrate potential back to the same potential as the source potential of the MOS transistor when a signal (SN4a) output by a logic cone whose substrate potential is to be controlled (i.e., the logic cone 604) goes to the H level.

In the above-described semiconductor integrated circuit 600, as shown in FIG. 16, the signals SN1a, SN2a and SN3a go from the L level to the H level in this order (i.e., in ascending order of the probability that the logic cone 604 is operated). Therefore, the substrate potential of the logic cone 604 is controlled to be decreased by the substrate supply potential switching section 610 with an increase in the operation probability.

Specifically, according to this embodiment, as the probability that the logic cone is operated is increased, the substrate potential is controlled in a stepwise manner. Therefore, when the logic cone comes to a state where the logic cone actually starts to be operated, the logic cone can immediately go to a state where a high-speed operation can be performed. Conversely, when the logic cone does not start to be operated, it is easy to change the substrate potential back to the low leakage state.

Although the substrate supply potential switching section 610 is provided only for the logic cone 604 in the example of FIG. 15, a substrate supply potential switching section may be provided for another logic cone. Also, in this embodiment, the power source potential can be controlled instead of the substrate potential, or both the substrate potential and the power source potential can be controlled.

Note that the relationship between the signal levels and the meanings described in each of the above-described embodiments is only for illustrative purposes and is not restrictive.

Also, when Embodiments 1, 2, 4, 5 and 6 are applied to a semiconductor integrated circuit having a chip structure comprising MOS transistors having the so-called double-gate structure of FIG. 4, the potential of the back gate may be controlled instead of controlling the substrate potential using the substrate supply potential switching section 110 or the substrate supply potential switching section 120.

Also, in Embodiments 1, 2, 4, 5 and 6, the potential of the first substrate supply line is the same potential as the source potential of the MOS transistor in the logic cone, and the potential of the second substrate supply line is a potential which supplies a shallow substrate potential (forward bias). The potential of the first substrate supply line needs not to be in a direction which causes the substrate potential (forward bias) to be shallower than the substrate supply level of the second substrate supply line. For example, when a potential (so-called reverse bias) which is deeper than the source potential is supplied to the first substrate supply line, it is possible to further suppress the subthreshold current, so that it can be expected that the effect of reducing the leakage current can be increased.

Also, although the substrate potential or the power source potential is switched by the switch circuit in each of the above-described embodiments, the switching means is not limited to this. For example, the switching means may be configured using a small-scale power source circuit, a DAC (digital analog converter), or the like. In this case, by converting the level of a voltage to be supplied for each logic cone, a substrate bias value can be controlled, depending on the circuit speed.

Also, in Embodiments 1 to 5, it has been described that the substrate potential or the power source potential is controlled in accordance with the transition of one input signal. The substrate supply potential switching section or the power source supply potential switching section may be configured so that, when a logic cone whose substrate potential or power source potential is to be controlled is operated in accordance with signals received from a plurality of logic cones, signals are input from the plurality of logic cones to a switch control circuit, and the substrate potential is switched based on the transition of these signals.

Also, if the substrate supply potential switching section or the power source supply potential switching section is arranged in parallel with the arrangement of logic cones (i.e., in a direction in which the signal of the logic cone is propagated), it is possible to avoid an increase in area due to redundant isolation on the layout, thereby making it possible to control the threshold potential or the power source potential with higher speed.

Also, although an exemplary synchronous system in which each functional module is operated in synchronization with the system clock CLK has been described in each embodiment, the above-described control of the threshold potential or the power source potential may be performed in an asynchronous system. In the asynchronous system, any of the logic cones is operated based on a request signal to a functional module, and the next logic cone is operated based on the output of that logic cone. Thus, also in the asynchronous system, the threshold potential or the power source potential can be controlled based on the output of each logic cone, as in the synchronous system.

As described above, the semiconductor integrated circuit of the present invention has an effect that the power consumption of a logic circuit which is not operated in a functional module can be reduced while a high-speed operation is achieved, and is useful as, for example, a semiconductor integrated circuit having logic circuits comprised of MOS transistors.

What is claimed is:

1. A semiconductor integrated circuit having MOS transistors, comprising:
   a functional module having a plurality of logic cones including a plurality of logic circuits; and
   a potential switching section connected to at least one of the logic cones and for controlling a substrate potential of the connected logic cone,
   wherein the logic cones have a structure in which substrates thereof are isolated from each other, are operated in accordance with predetermined input signals, and output signals depending on the input signals, and
   the potential switching section switches the substrate potential of the connected logic cone to any of a first substrate bias supply potential and a second substrate bias supply potential shallower than the first substrate bias supply potential in accordance with a signal output as the input signal by any of the logic cones.

2. A semiconductor integrated circuit having MOS transistors, comprising:
   a functional module having a plurality of logic cones including a plurality of logic circuits; and
   a potential switching section connected to at least one of the logic cones and for controlling a power source potential of the connected logic cone,
   wherein the logic cones have a structure in which power sources thereof are isolated from each other, are operated in accordance with predetermined input signals, and output signals depending on the input signals, and
   the potential switching section switches the power source potential of the connected logic cone to any of a first power source potential and a second power source potential lower than the first power source potential in accordance with a signal output as the input signal by any of the logic cones.

3. A semiconductor integrated circuit having MOS transistors, comprising:
   a functional module having a plurality of logic cones including a plurality of logic circuits; and
   a potential switching section connected to at least one of the logic cones and for controlling a substrate potential and a power source potential of the connected logic cone,
   wherein the potential switching section, when controlling the substrate potential, switches the substrate potential of the connected logic cone to any of a first substrate bias supply potential and a second substrate bias supply potential shallower than the first substrate bias supply potential in accordance with a signal output as the input signal by any of the logic cones, and when controlling the power source potential, switches the power source potential of the connected logic cone to any of a first power source potential and a second power source potential lower than the first power source potential in accordance with a signal output as the input signal by any of the logic cones.

4. A semiconductor integrated circuit having MOS transistors, comprising:
   a functional module having a plurality of logic cones including a plurality of logic circuits; and
   a potential switching section connected to at least one of the logic cones and for controlling a back gate voltage of the connected logic cone,
   wherein the logic cones have a structure in which the back gate voltage can be controlled into voltages different from each other, are operated in accordance with predetermined input signals, and output signals depending on the input signals, and
   the potential switching section switches the back gate voltage of the connected logic cone to any of a first back gate voltage and a second back gate voltage lower than the first back gate voltage in accordance with a signal output as the input signal by any of the logic cones.

5. The semiconductor integrated circuit of claim 2, further comprising:
a level shifter for converting the signal output by the logic cone into a voltage suitable as the input signal.

6. The semiconductor integrated circuit of claim 1, wherein the potential switching section comprises:
a switch circuit for selecting any of the first substrate bias supply potential and the second substrate bias supply potential; and
a switch control circuit for switching the switch circuit in accordance with the signal output as the input signal by any of the logic cones.

7. The semiconductor integrated circuit of claim 2, wherein the potential switching section comprises:
a switch circuit for selecting any of the first power source potential and the second power source potential; and
a switch control circuit for switching the switch circuit in accordance with the signal output as the input signal by any of the logic cones.

8. The semiconductor integrated circuit of claim 6, wherein the switch circuit includes a MOS transistor,
the MOS transistor of the switch circuit has a gate insulating film thickness thicker than that of the MOS transistor included in the logic cone.

9. The semiconductor integrated circuit of claim 6, wherein the switch circuit and the switch control circuit include a MOS transistor, and
the MOS transistor of the switch control circuit has a gate insulating film thickness thinner than that of the MOS transistor included in the switch circuit.

10. The semiconductor integrated circuit of claim 1, wherein the potential switching section performs the switching when an operation of the connected logic cone is completed.

11. The semiconductor integrated circuit of claim 1, wherein the potential switching section performs the switching in accordance with a signal output by a logic cone previous to the connected logic cone.

12. The semiconductor integrated circuit of claim 11, wherein the potential switching section performs the switching in accordance with a signal output by a logic cone immediately previous to the connected logic cone.

13. The semiconductor integrated circuit of claim 1, wherein the potential switching section performs the switching in a stepwise manner in accordance with signals output by a plurality of logic cones previous to the connected logic cone.

14. The semiconductor integrated circuit of claim 1, wherein the substrate has a silicon-on-insulator (SOI) structure.

15. The semiconductor integrated circuit of claim 1, wherein the potential switching section is provided corresponding to each logic cone and is arranged in parallel with an arrangement of the plurality of logic cones.

16. The semiconductor integrated circuit of claim 1, wherein the functional module is operated in synchronization with a clock signal, and
an operation of the logic cone is completed within one cycle of the clock signal.

17. The semiconductor integrated circuit of claim 3, further comprising:
a level shifter for converting the signal output by the logic cone into a voltage suitable as the input signal.

18. The semiconductor integrated circuit of claim 7, wherein the switch circuit includes a MOS transistor, and the MOS transistor of the switch circuit has a gate insulating film thickness thicker than that of the MOS transistor included in the logic cone.

19. The semiconductor integrated circuit of claim 7, wherein the switch circuit and the switch control circuit include a MOS transistor, and
the MOS transistor of the switch control circuit has a gate insulating film thickness thinner than that of the MOS transistor included in the switch circuit.

20. The semiconductor integrated circuit of claim 2, wherein the potential switching section performs the switching when an operation of the connected logic cone is completed.

21. The semiconductor integrated circuit of claim 3, wherein the potential switching section performs the switching when an operation of the connected logic cone is completed.

22. The semiconductor integrated circuit of claim 4, wherein the potential switching section performs the switching when an operation of the connected logic cone is completed.

23. The semiconductor integrated circuit of claim 2, wherein the potential switching section performs the switching in accordance with a signal output by a logic cone previous to the connected logic cone.

24. The semiconductor integrated circuit of claim 3, wherein the potential switching section performs the switching in accordance with a signal output by a logic cone previous to the connected logic cone.

25. The semiconductor integrated circuit of claim 4, wherein the potential switching section performs the switching in accordance with a signal output by a logic cone previous to the connected logic cone.

26. The semiconductor integrated circuit of claim 23, wherein the potential switching section performs the switching in accordance with a signal output by a logic cone immediately previous to the connected logic cone.

27. The semiconductor integrated circuit of claim 24, wherein the potential switching section performs the switching in accordance with a signal output by a logic cone immediately previous to the connected logic cone.

28. The semiconductor integrated circuit of claim 25, wherein the potential switching section performs the switching in accordance with a signal output by a logic cone immediately previous to the connected logic cone.

29. The semiconductor integrated circuit of claim 2, wherein the potential switching section performs the switching in a stepwise manner in accordance with signals output by a plurality of logic cones previous to the connected logic cone.

30. The semiconductor integrated circuit of claim 3, wherein the potential switching section performs the switching in a stepwise manner in accordance with signals output by a plurality of logic cones previous to the connected logic cone.

31. The semiconductor integrated circuit of claim 4, wherein the potential switching section performs the switching in a stepwise manner in accordance with signals output by a plurality of logic cones previous to the connected logic cone.

32. The semiconductor integrated circuit of claim 2, wherein the substrate has a silicon-on-insulator (SOI) structure.

33. The semiconductor integrated circuit of claim 3, wherein the substrate has a silicon-on-insulator (SOI) structure.

34. The semiconductor integrated circuit of claim 2, wherein the potential switching section is provided corresponding to each logic cone and is arranged in parallel with an arrangement of the plurality of logic cones.

35. The semiconductor integrated circuit of claim 3, wherein the potential switching section is provided corresponding to each logic cone and is arranged in parallel with an arrangement of the plurality of logic cones.

36. The semiconductor integrated circuit of claim 4, wherein the potential switching section is provided corresponding to each logic cone and is arranged in parallel with an arrangement of the plurality of logic cones.

37. The semiconductor integrated circuit of claim 2, wherein the functional module is operated in synchronization with a clock signal, and an operation of the logic cone is completed within one cycle of the clock signal.

38. The semiconductor integrated circuit of claim 3, wherein the functional module is operated in synchronization with a clock signal, and an operation of the logic cone is completed within one cycle of the clock signal.

39. The semiconductor integrated circuit of claim 4, wherein the functional module is operated in synchronization with a clock signal, and an operation of the logic cone is completed within one cycle of the clock signal.

* * * * *